(12) United States Patent
Fujimoto et al.

(10) Patent No.: US 6,578,772 B2
(45) Date of Patent: Jun. 17, 2003

(54) TREATMENT SOLUTION SUPPLY APPARATUS AND TREATMENT SOLUTION SUPPLY METHOD

(75) Inventors: Akihiro Fujimoto, Kikuchi-gun (JP); Kousuke Yoshihara, Kikuchi-gun (JP); Masahiro Enomoto, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 61 days.

(21) Appl. No.: 09/816,457

(22) Filed: Mar. 26, 2001

(65) Prior Publication Data

US 2001/0025890 A1 Oct. 4, 2001

(30) Foreign Application Priority Data

Mar. 27, 2000 (JP) ........................................ 2000-087342

(51) Int. Cl.[7] ............................................... B05B 17/00
(52) U.S. Cl. .......................... 239/1; 239/124; 239/127; 239/331; 427/421
(58) Field of Search ................ 239/124, 127, 239/330, 331, 332, 334; 427/421

(56) References Cited

U.S. PATENT DOCUMENTS

| | | | | |
|---|---|---|---|---|
| 3,826,426 A | * | 7/1974 | Bonvicini | 239/127 |
| 3,901,184 A | * | 8/1975 | Payne et al. | 118/629 |
| 4,015,613 A | * | 4/1977 | Papworth | 134/102.2 |
| 4,277,001 A | * | 7/1981 | Nozawa | 222/321.4 |
| 4,516,725 A | * | 5/1985 | Cavanaugh et al. | 239/127 |
| 5,648,221 A | * | 7/1997 | Foster | 239/333 |
| 5,725,664 A | * | 3/1998 | Nanbu et al. | 118/52 |
| 6,056,998 A | * | 5/2000 | Fujimoto | 427/240 |

* cited by examiner

*Primary Examiner*—Michael Mar
*Assistant Examiner*—Christopher Kim
(74) *Attorney, Agent, or Firm*—Oblon, Spivak, McClelland, Maier & Neustadt, P.C.

(57) ABSTRACT

The present invention is a treatment solution supply apparatus for supplying a treatment solution onto a substrate and includes: a discharge nozzle for discharging the treatment solution onto the substrate; a container for storing the treatment solution; a supply piping for connecting the discharge nozzle and the container; a pump provided along the supply piping; a pump drive mechanism for controlling operation of the pump; a circulation piping having one end branching out from the piping between the container and the pump and another end provided at the pump; a filter, provided at some midpoint along the supply piping and between the one end and the other end of the circulation piping, for filtering the treatment solution to remove a foreign substance; a drain piping for draining the treatment solution filtered by the filter and containing the foreign substance; and a valve provided along the drain piping for controlling a flow rate of the treatment solution drained from the filter. According to the present invention, the treatment solution is supplied with part thereof being circulated through the circulation piping, so that the part of the treatment solution passes through the filter again to be discharged from the discharge nozzle. Consequently, foreign substances existing in the treatment solution can be efficiently removed.

18 Claims, 18 Drawing Sheets

TREATMENT SOLUTION SUPPLY APPARATUS AND TREATMENT SOLUTION SUPPLY METHOD

BACKGROUND OF THE INVENTION

1. Field of the Invention

The present invention relates to a treatment solution supply apparatus for supplying a treatment solution onto a substrate and a method therefor.

2. Description of the Related Art

Conventionally, in a resist solution supply unit for supplying a resist solution to a substrate, for example, a wafer W or the like, a treatment solution is sent from a container storing the treatment solution to a resist nozzle by a pump, and a predetermined amount thereof is discharged from the resist nozzle, thereby supplying the resist solution.

Such a resist solution supply unit employs a method of sending gas into the container storing the resist solution to pressurize the resist solution in the container to supply the resist solution, whereby air bubbles easily occur due to the pressurization of the resist solution. The discharge of such a resist solution containing air bubbles toward the wafer W presents a problem that the resist solution does not extend uniformly over the front face of the wafer W.

Therefore, a method of removing air bubbles by filtering the resist solution has been considered to prevent the occurrence of air bubbles. By this method, however, it is easy to remove air bubbles which have already become manifested, but it is extremely difficult to remove air bubbles which are gradually formed through a large number of discharge steps.

SUMMARY OF THE INVENTION

The present invention is made to solve the above-described problem, and its object is to provide a treatment solution supply apparatus and a treatment solution supply method each for efficiently removing air bubbles.

The treatment solution supply apparatus of the present invention is a treatment solution supply apparatus for supplying a treatment solution onto a substrate, including: a discharge nozzle for discharging the treatment solution onto the substrate; a container for storing the treatment solution; a supply piping for connecting the discharge nozzle and the container; a pump provided along the supply piping; a pump drive mechanism for controlling operation of the pump; a circulation piping having one end branching out from the piping between the container and the pump and another end provided at the pump; a filter, provided at some midpoint along the supply piping and between the one end and the other end of the circulation piping, for filtering the treatment solution to remove a foreign substance; a drain piping for draining the treatment solution filtered by the filter and containing the foreign substance; and a valve provided along the drain piping for controlling a flow rate of the treatment solution drained from the filter.

The treatment solution supply method of the present invention is a treatment solution supply method of supplying a treatment solution onto a substrate, including: step of preparing a discharge nozzle for discharging the treatment solution onto the substrate; a container for storing the treatment solution; a supply piping for connecting the discharge nozzle and the container; a pump provided along the supply piping; a pump drive mechanism for controlling operation of the pump; a circulation piping having one end branching out from the piping between the container and the pump and another end provided at the pump; a filter, provided at some midpoint along the supply piping and between the one end and the other end of the circulation piping, for filtering the treatment solution to remove a foreign substance; a drain piping for draining the treatment solution filtered by the filter and containing the foreign substance; and a valve provided along the drain piping for controlling a flow rate of the treatment solution drained from the filter; suction step of sucking the treatment solution from the container to the pump; and discharge step of discharging the treatment solution sucked into the pump to the discharge nozzle and circulating the treatment solution through the circulation piping to separate at least part of air bubbles in the treatment solution by the filter.

Incidentally, the foreign substances include not only suspended particles but also air bubbles contained in the resist solution.

According to the present invention, the treatment solution is supplied with part thereof being circulated through the circulation piping, so that the part of the treatment solution passes through the filter again to be discharged from the discharge nozzle. Consequently, foreign substances existing in the treatment solution can be efficiently removed. Further, the foreign substances such as air bubbles and the like contained in the treatment solution can be stocked in the filter in a normal discharge step, thereby realizing easy bubble venting control.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

Hereinafter, preferred embodiments of the present invention will be described with reference to the drawings.
(First embodiment)
(Configuration of coating and developing system)

Figure 1:
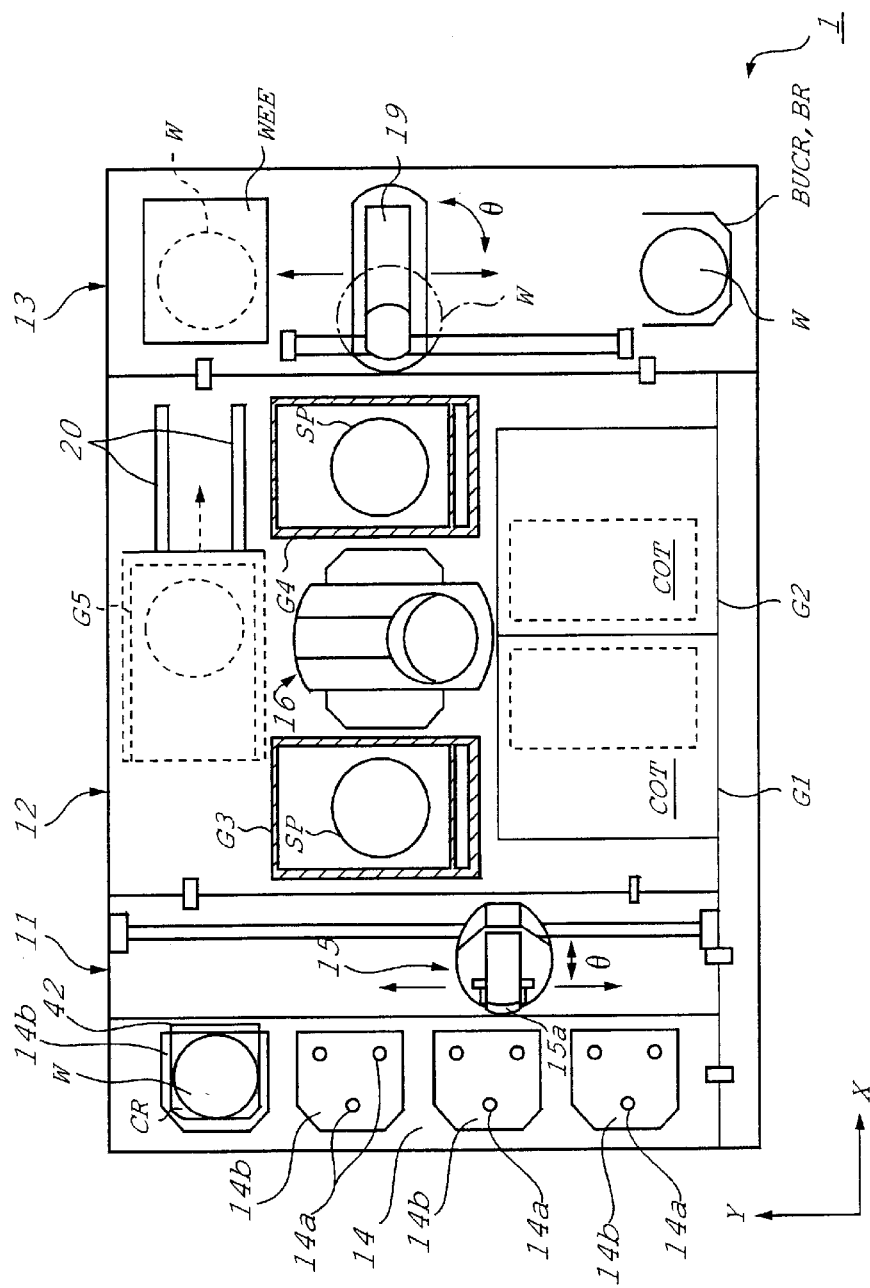
FIG. 1 is a view showing the entire configuration of a coating and developing system including a treatment solution supply apparatus according to an embodiment of the present invention.

FIG. 1 is a view showing the entire configuration of a coating and developing system to which a substrate processing apparatus according to an embodiment of the present invention is applied.

As shown in FIG. 1, a coating and developing system 1 includes a cassette station 11 for receiving a plurality of cassettes CR, a processing section 12 for performing processing such as resist coating and developing for a wafer W, and an interface section 13 for delivering the wafer W coated with a resist solution to/from an aligner (not shown). Th cassette station 11 includes a mounting table 14 where the cassette CR housing, for example, 25 semiconductor wafers as a unit is carried in/out, and a first sub-arm mechanism 15 for taking the wafer W out of the cassette CR.

The mounting table 14 is provided extended in a Y-axis direction, and the cassettes CR are mounted on the mounting table 14 at equal pitches. In the cassette station 11, as shown in FIG. 1, for example, four slide stages 14b which are cassette transfer mechanisms are arranged on the mounting table 14, and when the cassette CR is mounted on each slide stage 14b, the cassette CR is positioned by three projections 14a with a wafer port 41 facing the processing section 12 side.

The first sub-arm mechanism 15 can deliver the wafer W to a main arm mechanism 16 of the processing section 12, and can get access also to an alignment unit (ALIM) and an extension unit (EXT) included in multi-tiered units of a third processing unit group G3 on the processing section 12 side.

Figure 3:
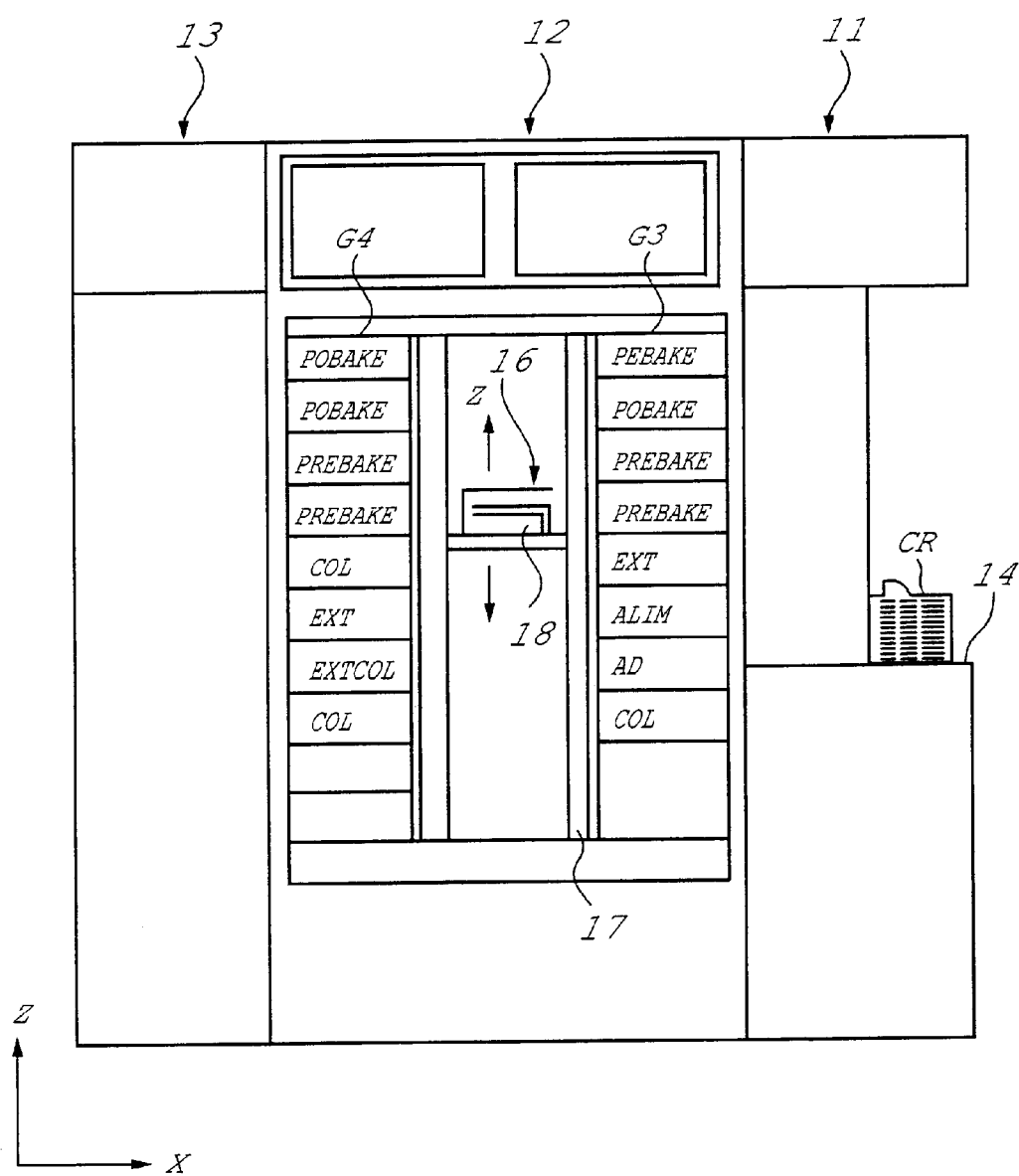
FIG. 3 is a rear view of the coating and developing system in FIG. 1.

The delivery of the wafer W between the cassette station 11 and the processing section 12 is performed via the third processing unit group G3. The third processing unit group G3 is constituted by stacking a plurality of processing units into a vertically multi-tiered form as shown in FIG. 3. More specifically, the third processing unit group G3 is constituted by stacking in order from the bottom to the top, for example, a cooling unit (COL) for performing cooling treatment for the wafer W, an adhesion unit (AD) for performing hydrophobic processing to enhance fixedness of the resist solution to the wafer W, an alignment unit (ALIM) for performing alignment of the wafer W, an extension unit (EXT) for allowing the wafer W to wait therein, two pre-baking units (PREBAKE) for performing heat treatment for a resist film before exposure processing, a post-baking unit (POBAKE) for performing heat treatment for the resist film after the exposure processing, and a post-exposure baking unit (PEBAKE) for performing heat treatment after the exposure.

The delivery of the wafer W to the main arm mechanism 16 is performed via the extension unit (EXT) and the alignment unit (ALIM).

Further, as shown in FIG. 1, first to fifth processing unit groups G1 to G5 containing the third processing unit group G3 are arranged around the main arm mechanism 16 to surround it. The other processing unit groups G1, G2, G4, and G5 are constituted by stacking various kinds of units in the vertical direction as in the aforementioned third processing unit group G3.

On the other hand, the main arm mechanism 16, as shown in FIG. 3, is provided with a main arm 18 ascendable and descendable in the vertical direction (a Z-direction) inside a cylindrical guide 17 extended in the vertical direction. The cylindrical guide 17 is connected to a rotation shaft of a motor (not shown), and rotates integrally with the main arm 18 around the rotation shaft by rotational driving force of the motor, whereby the main arm 18 is rotatable in a θ-direction. Incidentally, the cylindrical guide 17 may be connected to another rotation shaft (not shown) which is rotated by the aforementioned motor. The main arm 18 is moved in the vertical direction as described above to thereby allow the wafer W to get access freely to each processing unit in the processing unit groups G1 to G5.

The main arm mechanism 16 which has received the wafer W from the cassette station 11 via the extension unit (EXT) of the third processing unit group G3 first carries it into the adhesion unit (AD) of the third processing unit group G3 to subject it to hydrophobic processing. Then, the main arm mechanism 16 carries the wafer W out of the adhesion unit (AD) and subjects it to cooling treatment in the cooling unit (COL).

The wafer W which has been subjected to the cooling treatment is positioned opposed to and carried into the resist solution coating unit (COT) in the first processing unit group G1 (or in the second processing unit group G2) by the main arm mechanism 16.

The wafer W coated with the resist solution is unloaded by the main arm mechanism 16 and delivered to the interface section 13 via the fourth processing unit group G4.

The fourth processing unit group G4 is, as shown in FIG. 3, constituted by stacking in order from the bottom to the top, for example, a cooling unit (COL), an extension and cooling unit (EXT/COL), an extension unit (EXT), a cooling unit (COL), two pre-baking units (PREBAKE), and two post-baking units (POBAKE).

The wafer W taken out of the resist solution coating unit (COT) is first inserted into the pre-baking unit (PREBAKE) to be dried by volatilizing a solvent (a thinner) from the resist solution. Incidentally, this drying may be performed by a method of reducing pressure. More specifically, it may be a method of inserting the wafer W into the pre-baking unit (PREBAKE) or into a chamber which is provided separately therefrom and reducing a pressure surrounding the wafer W to thereby remove the solvent (to dry the resist solution).

The wafer W is then cooled in the cooling unit (COL) and thereafter delivered to a second sub-arm mechanism 19 provided in the interface section 13 via the extension unit (EXT).

The second sub-arm mechanism 19 which has received the wafer W houses the received wafer W one after another into a buffer cassette BUCR. The interface section 13 delivers the wafer W to the not shown aligner and receives the wafer W after exposure processing.

The wafer W after the exposure is, after its unnecessary resist film at the periphery being exposed to light in a peripheral aligner (WEE), delivered to the main arm mechanism 16 via a reverse operation to the aforementioned. The main arm mechanism 16 inserts the wafer W after the exposure into the post-exposure baking unit (PEBAKE), where the wafer W is subjected to heat treatment and then to cooling treatment to a predetermined temperature in the cooling unit (COL). Thereafter, the main arm mechanism 16 inserts the wafer W into the developing unit (DEV) to subject the wafer W to development. The wafer W after the developing treatment is transferred to any of the post-baking units (POBAKE) and dried by heating, and thereafter it is transferred to the cassette station 11 via the extension unit (EXT) of the third processing unit group G3 and housed in the cassette CR.

It should be noted that the fifth processing unit group G5 is selectively provided and configured similarly to the fourth processing unit group G4 in this embodiment. Further, the fifth processing unit group G5 is held to be movable by rails 20, so that maintenance operation can be easily performed to the main arm mechanism 16 and the first to fourth processing unit groups G1 to G4.

Figure 2:
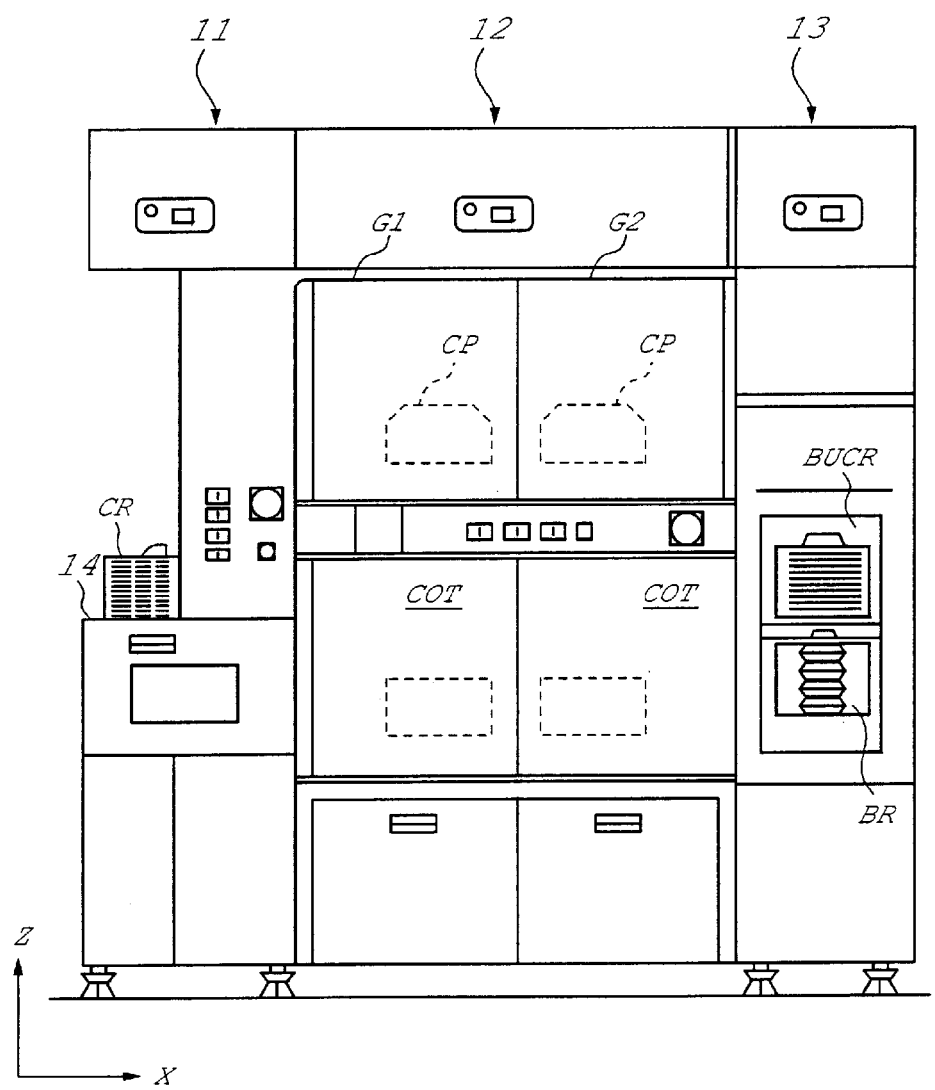
FIG. 2 is a front view of the coating and developing system in FIG. 1.

The treatment solution supply apparatus of the present invention is applied to the coating and developing system shown in FIG. 1 to FIG. 3, processing units being stacked in the vertical direction, thereby remarkably reducing the footprint of the system.

(Entire configuration of resist coating unit)

Figure 4:
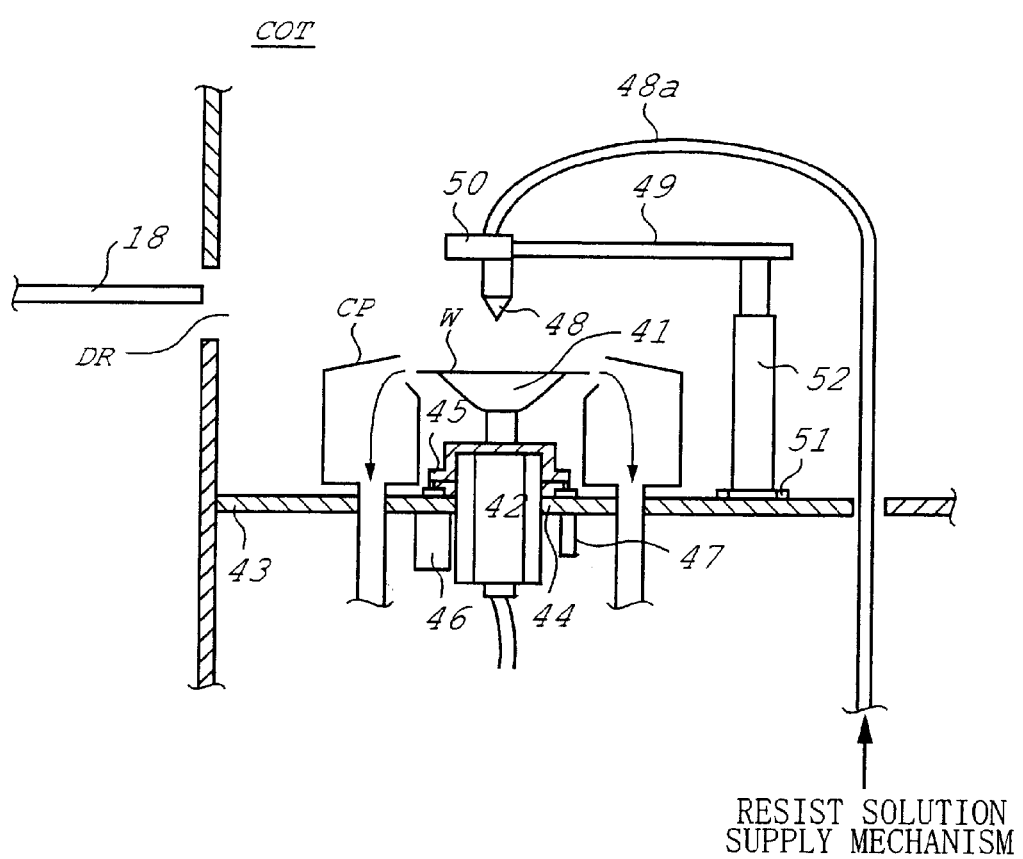
FIG. 4 is a vertical sectional view showing the configuration of a resist coating unit according to an embodiment of the present invention.

FIG. 4 is a vertical sectional view showing the entire configuration of the resist coating unit (COT) to which the treatment solution supply apparatus according to the present invention is applied. As shown in FIG. 4, at the center of the resist coating unit (COT) an annular cup CP is disposed, and a spin chuck 41 is disposed inside the cup CP. The spin chuck 41 is rotationally driven by a driving motor 42 with securely holding the wafer W by vacuum suction.

The driving motor 42 is disposed to be ascendable and descendable in an opening 44 provided in a unit bottom plate 43 and is coupled with a raising and lowering driver 46 and a raising and lowering guide means 47 each of which is composed of, for example, an air cylinder through a cap-shaped flange member 45 made of, for example, aluminum.

A resist nozzle 48 for discharging the resist solution as a coating solution to the front face of the wafer W is detachably attached to the tip of a resist nozzle scan arm 49 through a nozzle holder 50. The resist nozzle scan arm 49, attached to the upper end of a vertical support member 52 which is horizontally movable on guide rails 51 laid in one direction (the Y-direction) on the unit bottom plate 43, is movable in the Y-direction integrally with the vertical support member 52 by a not shown Y-direction drive mechanism.

As shown in FIG. 4, the resist nozzle 48 is connected to a resist solution supply mechanism (not shown) disposed in a lower chamber of the resist coating unit (COT) through a resist supply pipe 48a.

Figure 5:
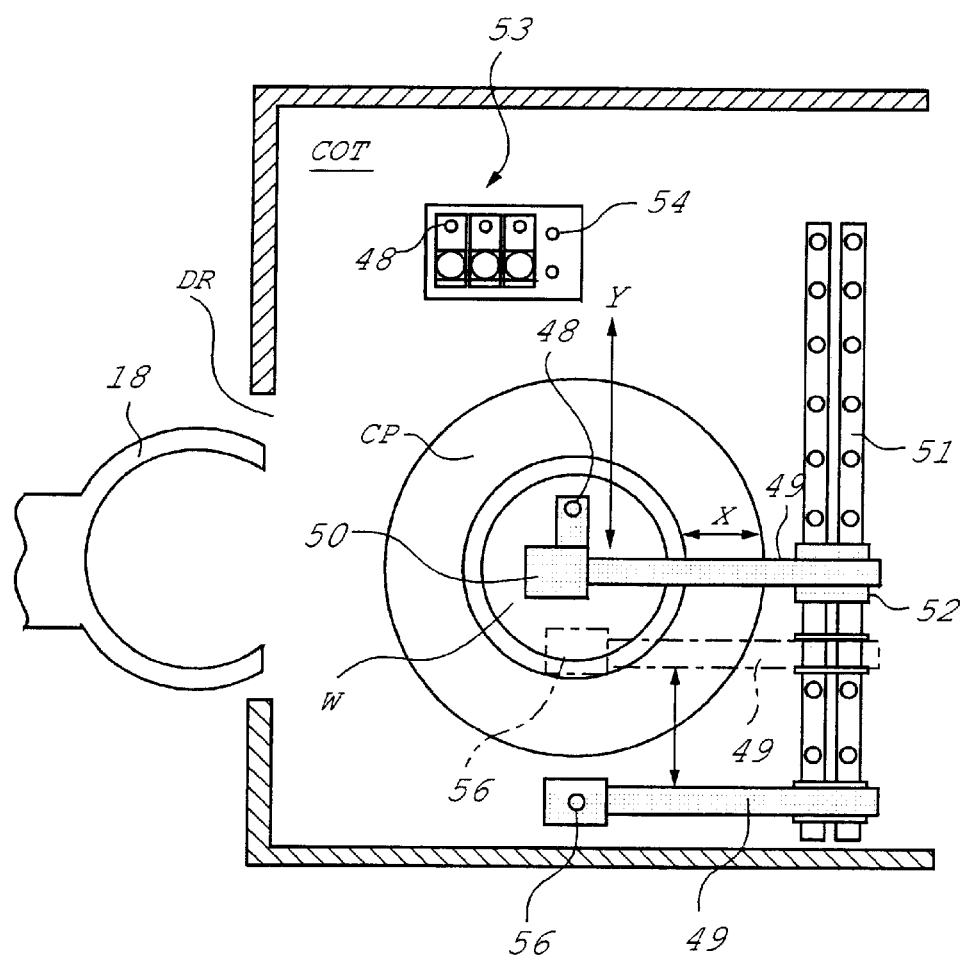
FIG. 5 is a plan view showing the configuration of the resist coating unit (COT) in FIG. 4.

FIG. 5 is a plan view of the resist coating unit (COT) according to this embodiment. The resist nozzle scan arm 49 is movable also in an X-direction orthogonal to the Y-direction to attach selectively the resist nozzle 48 thereto at a resist nozzle waiting portion 53, and thus it can move in the X-direction by means of a not shown X-direction drive mechanism.

Furthermore, a discharge port of the resist nozzle 48 is inserted into a mouth 54 of a solvent atmosphere chamber at the resist nozzle waiting portion 53 to be exposed to an atmosphere of a solvent therein, thereby preventing the resist solution at the tip of the resist nozzle 48 from curing or deteriorating. Moreover, a plurality of resist nozzles 48 are provided in accordance with the type or the viscosity of the resist solution, so that the nozzles are properly used in accordance with processing conditions.

Further, not only the vertical support member 52 for supporting the resist nozzle scan arm 49 but also a vertical support member 56 for supporting a rinse nozzle scan arm 55 and movable in the Y-direction is provided on the guide rails 51.

The rinse nozzle scan arm 55 is translated or linearly moved by a Y-direction drive mechanism (not shown) between a rinse nozzle waiting position shown by a solid line set at the side of the CP and a rinse solution discharge position shown by a one-dotted chain line set direct above the peripheral portion of the wafer W set on the spin chuck 41.

(Configuration of treatment solution supply system)

Figure 6A:
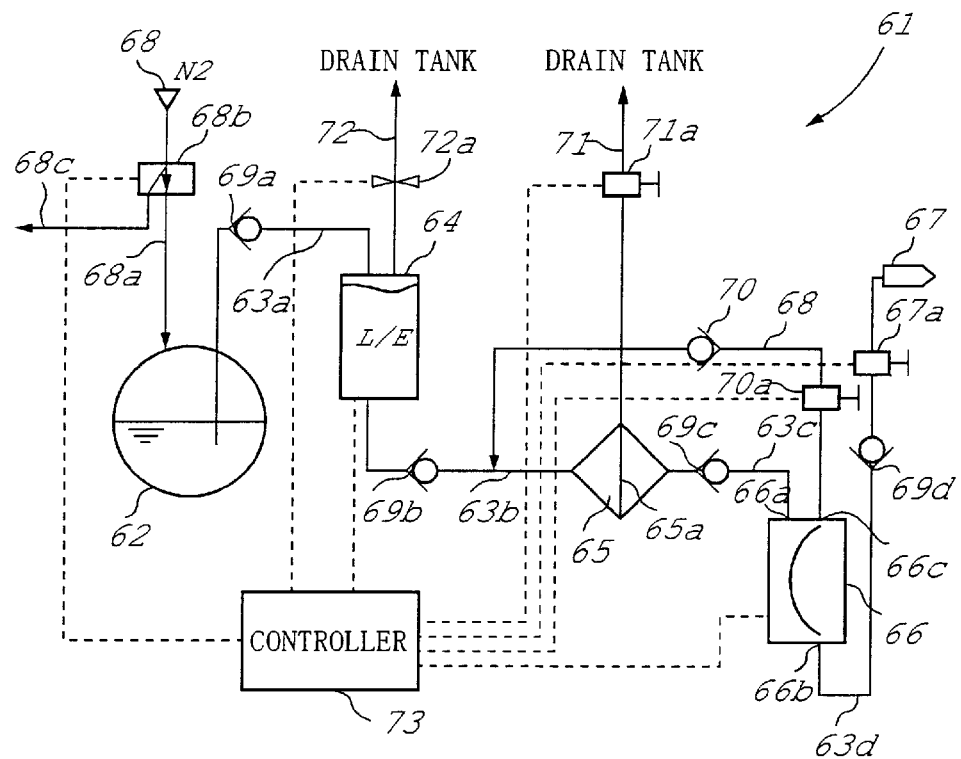
FIG. 6A is a schematic view showing a treatment solution supply system of the resist supply unit according to the embodiment.

FIG. 6 is a view showing the treatment solution supply system of the treatment solution supply apparatus according to this embodiment. As shown in FIG. 6A, a resist supply unit 61 has a resist tank 62 as a container and is provided with along supply pipings 63a to 63d as a discharge path of the resist solution supplied from the resist tank 62, in order from the upstream side to the downstream side of the discharge path: a liquid end sensor 64 for detecting a supply amount of the resist solution; a filter 65 for venting a dissolved gas and air bubbles in the resist solution and separating and removing foreign substances such as a suspended particle and the like; a pump 66 for discharging and sucking the resist solution; and a resist nozzle 67 for discharging the resist solution.

The resist tank 62 communicates with the liquid end sensor 64 through the supply piping 63a, the liquid end sensor 64 communicates with the filter 65 through the supply piping 63b, the filter 65 communicates with the pump 66 through the supply piping 63c, and the pump 66 communicates with the resist nozzle 67 through the supply piping 63d.

Figure 6B:
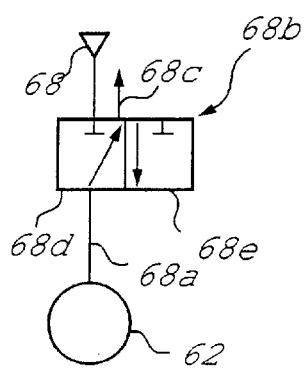
FIG. 6B is a view showing the configuration of an air-operated valve.
Figure 6C:
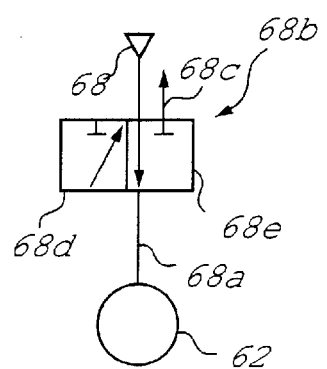
FIG. 6C is a view showing the configuration of the air-operated valve.

Further, to the resist tank 62 an $N_2$ gas supply mechanism 68 for pressurizing the resist solution in the tank is connected via a gas supply pipe 68a to supply smoothly the resist solution to the discharge path. Furthermore, the gas supply pipe 68a is equipped with a switching air-operated valve 68b. The detailed configuration of the air-operated valve 68b is shown in FIGS. 6B and 6C. The valve 68b includes a first flow path 68d and a second flow path 68e and can switch the flow paths 68d and 68e alternately by switching operation. In FIG. 6B, the first flow path 68d for $N_2$ pressure release has shifted to the side of the gas flow path from the $N_2$ gas supply mechanism 68 to the gas supply pipe 68a. The first flow path 68d blocks the gas flow path from the gas supply mechanism 68 to the gas supply pipe 68a and leads $N_2$ gas into a gas supply pipe 68c. The $N_2$ gas led into the gas supply pipe 68c is released outside the resist coating unit (COT) or its clean room. In FIG. 6C, the second flow path 68e for $N_2$ pressurization has shifted to the side of the gas flow path from the $N_2$ gas supply mechanism 68 to the gas supply pipe 68a. The second flow path 68e establishes the communication of the gas flow path from the gas supply mechanism 68 to the gas supply pipe 68a and blocks a supply port of the gas supply pipe 68c. This supplies $N_2$ gas into the tank 62, thereby pressurizing the resist solution in the tank 62.

(Configuration of pump and circulation system)

The periphery of the pump 66 is defined by a bottom wall, a side wall, and a ceiling wall. The pump 66 includes a suction port 66a for receiving a sucked resist solution and a discharge port 66b for discharging the resist solution and supplying it to the resist nozzle 67, and the flow path of the resist solution from the suction port 66a to the discharge port 66b defines the discharge path of the resist solution. Further, the pump 66 is provided with a circulation port 66c for releasing the resist solution from the pump 66 to circulate the resist solution. One end of a circulation piping 78 communicates with the circulation port 66c. The other end of the circulation piping 78 communicates with the supply piping 63b, defining a circulation path which is a path different from the discharge path of the resist solution via the filter 65 and returns the resist solution again into the discharge path bypassing the filter 65.

(Configuration of check valve)

Check valves 69a, 69b, 69c, and 69d are correspondingly provided along the supply pipings 63a, 63b, 63c, and 63d which define the discharge path of the resist solution to prevent the resist solution from flowing back through the discharge path. Further, a check valve 70 is provided along the circulation piping 78 to prevent the resist solution from flowing back through the circulation path.

(Detailed configuration of pump)

Figure 7:
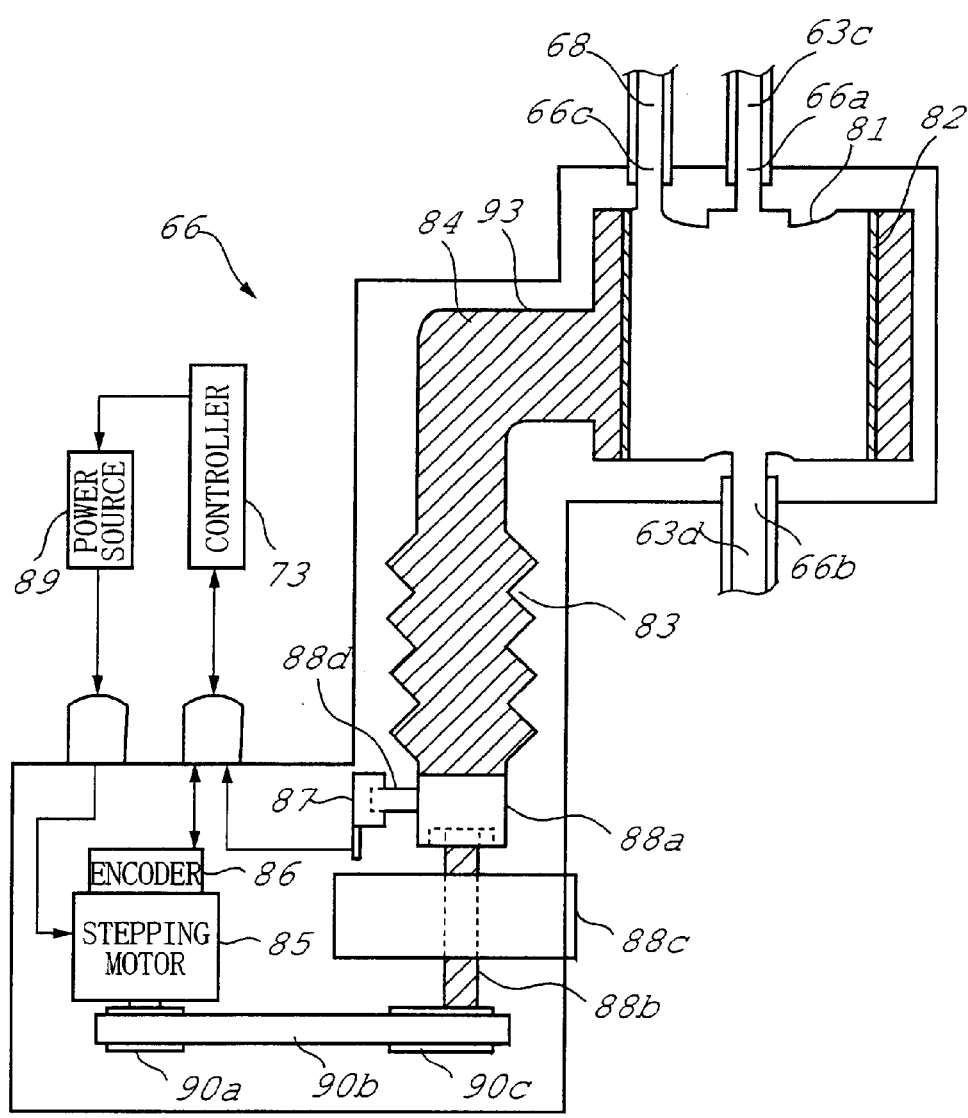
FIG. 7 is a view showing the detailed configuration of a pump according to the embodiment during suction operation.

FIG. 7 is a view showing the detailed configuration of the pump 66. The pump 66 is a tubular diaphragm pump which repeats suction and discharge of a solution by changing the internal pressure of a pump chamber 81. The pump chamber 81 has an almost cylindrical form and includes therein an elastic diaphragm 82 made of a PTFE resin. An oily matter which is a pressure transfer medium 84 is sealed in an entire bellows 83 and part of the pump chamber 81. The pressure transfer medium 84 is a medium for transferring a pump driving force produced by expansion and contraction of the bellows 83 to the elastic diaphragm 82 in the pump chamber 81. The bellows 83 is driven to expand and contract with high accuracy by a stepping motor 85 and its expansion/contraction operation timing and expansion/contraction speed, that is, its suction/discharge timing and suction/discharge speed of the resist solution are controlled by a controller 73 in accordance with set conditions. Further, the stepping motor 85 is equipped with an encoder 86.

A light transmission-type sensor 87 is provided near a movable supporter 88a. A shutter member 88d is attached to the movable supporter 88a to be able to cross an optical axis of the sensor 87 so as to detect variation of the bellows 83. As shown in FIG. 7, the shutter member 88d obstructs the optical axis of the sensor 87 where the bellows 83 expands to the maximum, that is, at the end of the solution suction step, preventing a photoreceptor of the sensor 87 from detecting light.

Figure 8:
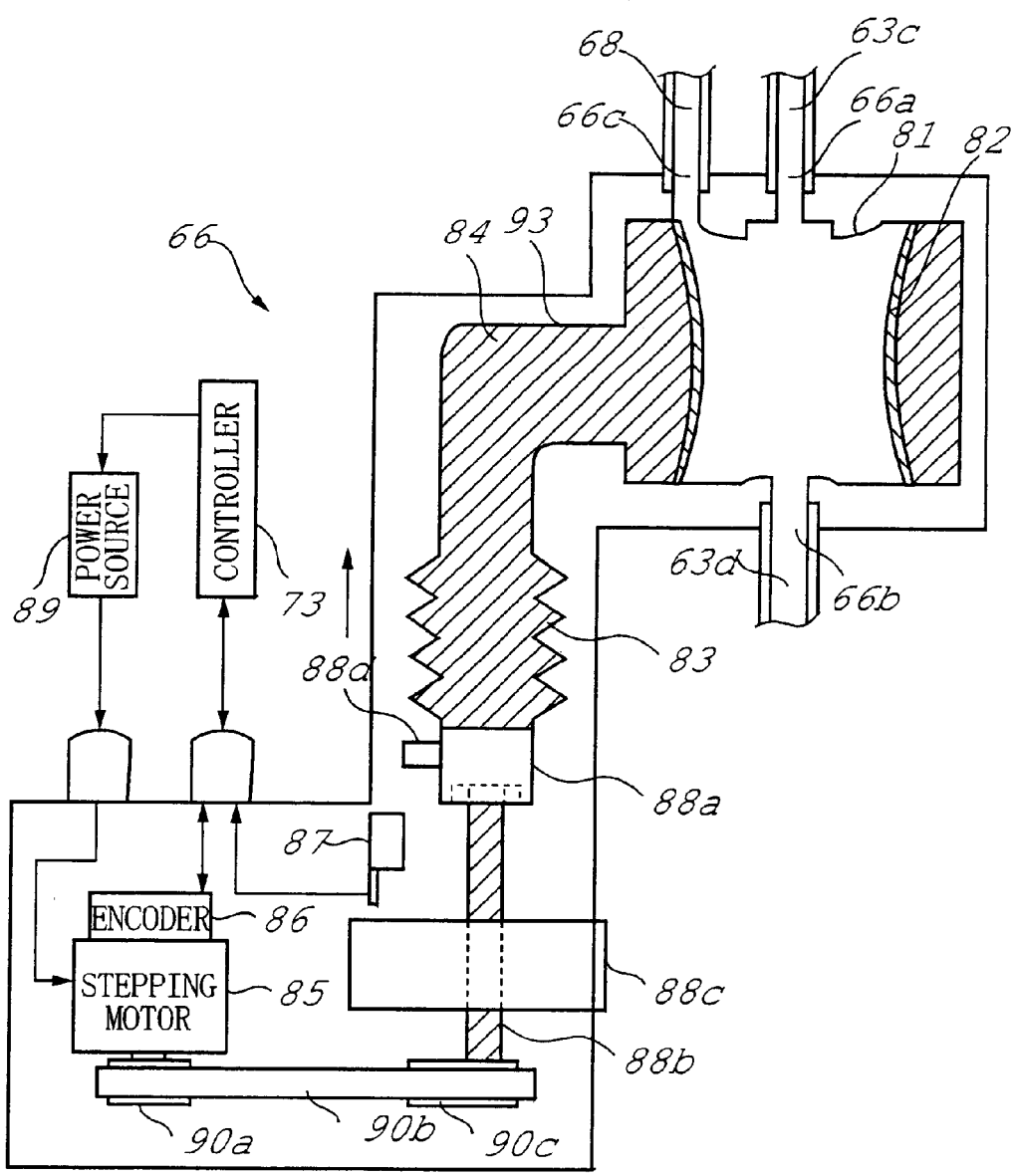
FIG. 8 is a view showing the detailed configuration of the pump according to the embodiment during discharge operation.

Meanwhile, as shown in FIG. 8, the shutter member 88d does not obstruct the optical axis of the sensor 87 where the bellows 83 contracts to the maximum, that is, at the end of the solution discharge step, allowing the photoreceptor of the sensor 87 to detect light. When its detection signal is inputted into the controller 73, the controller 73 issues a command to a power source 89 of the stepping motor 85 to a drive belt mechanism 90a to 90c and a ball screw 88 respectively so as to expand the bellows 83.

(Detailed configuration of pump chamber)

The detailed configuration of the pump chamber 81 will be explained hereafter.

Figure 9:
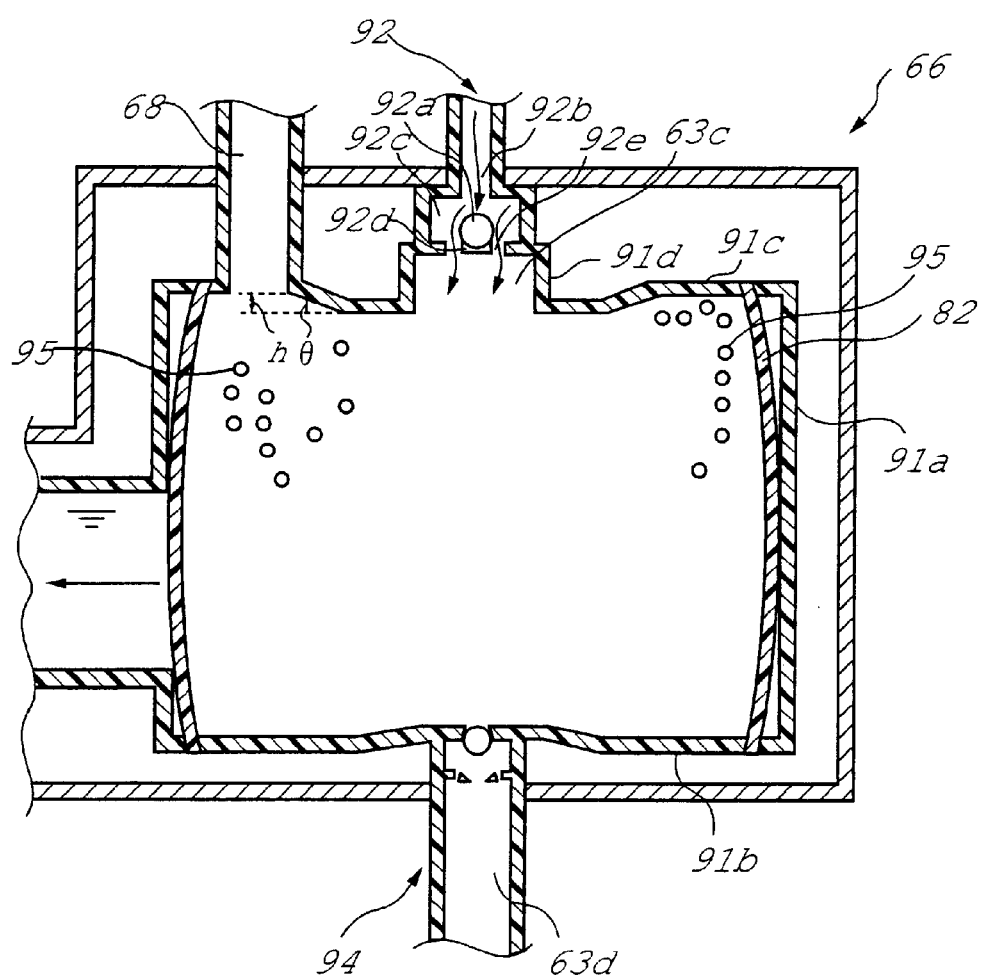
FIG. 9 is a view showing the detailed configuration in the pump chamber according to the embodiment during suction operation.
Figure 10:
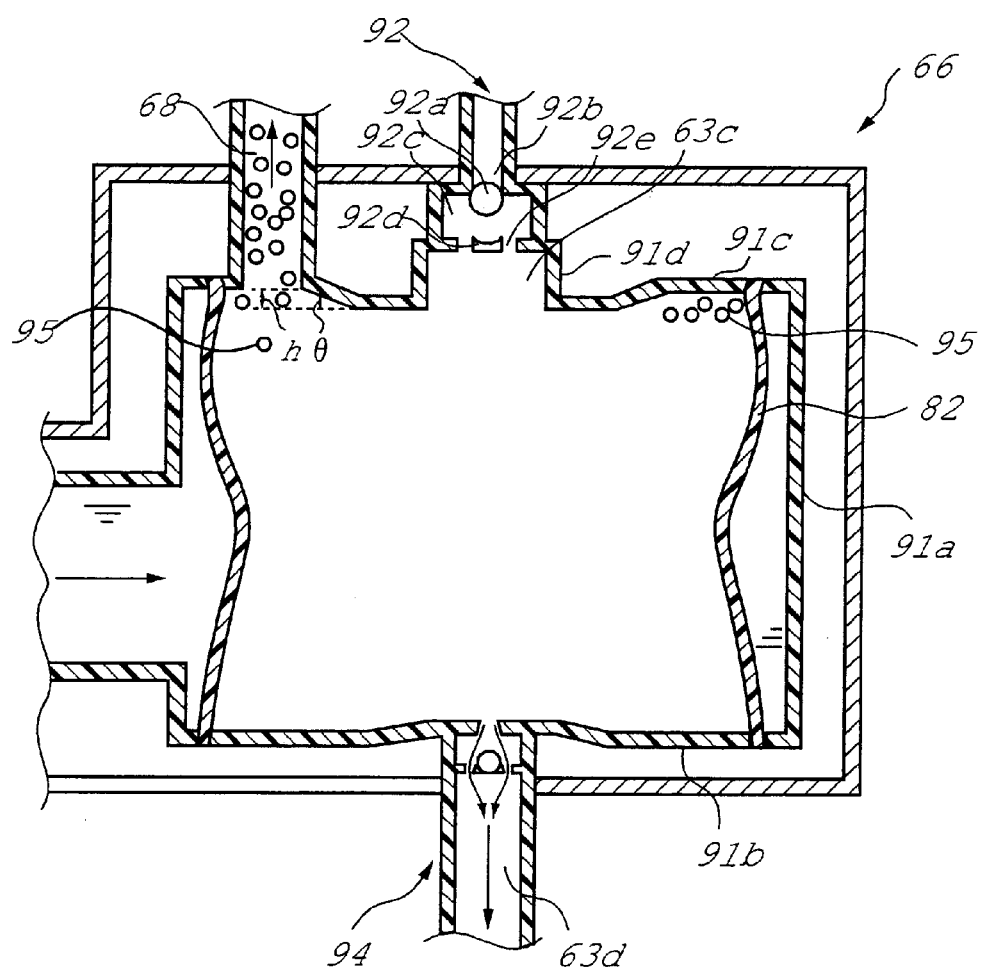
FIG. 10 is a view showing the detailed configuration in the pump chamber according to the embodiment during discharge operation.

FIG. 9 is a sectional view showing the detailed configuration of the pump chamber 81 shown in FIG. 7, and FIG. 10 is a sectional view showing the detailed configuration of the pump chamber 81 shown in FIG. 8.

The periphery of the pump chamber 81 is defined by a side wall 91a, a bottom wall 91b, and a ceiling wall 91c. The pump chamber 81 is partitioned into the inside and outside by the diaphragm 82, and the resist solution is supplied into the inner region of the diaphragm 82 and the pressure transfer medium 84 is sealed in the outside region of the diaphragm 82. A recess 91d is formed at the center of the ceiling wall 91c, and the supply piping 63c communicates with the recess 91d via a backflow valve 92. The backflow valve 92 comprises a ball 92a, an inlet 92b, a ball storage chamber 92c, a stopper 92d, and an outlet 92e.

In the suction step, the ball 92a fits in the stopper 92d, whereby the resist solution passes through the inlet 92b and the outlet 92e to flow into the pump chamber 81. In the discharge step, the ball 92a blocks the inlet 92b, whereby the resist solution does not flow into the pump chamber 81. The pump chamber 81 has a diameter from about 60 mm to about 70 mm and a height from about 60 mm to about 70 mm.

A tubular diaphragm 93 communicates with the pump chamber 81 through an opening of the side wall 91a to transfer the pump driving force from the bellows 83 to the diaphragm 82 via the pressure transfer medium 84. The diaphragm 82 is concentrically provided about the center of the pump chamber 81. The diaphragm 82 is made of an elastic resin material such as a tetrafluoroethylene-perfluoroalkylvinyl ether copolymer (PFA). Further, the circulation piping 78 is opened at the edge of the ceiling wall 91c. The edge of the ceiling wall 91c is higher in level than the center, and thus a bubble gathering portion 91e is formed there. During the suction step of the resist solution, air bubbles 95 gather to the bubble gathering portion 91e, and further during the discharge step, the air bubbles 95 from the bubble gathering portion 91e are drained from within the pump chamber 81 via the circulation piping 78. Incidentally, an inclination angle θ of the bubble gathering portion 91e with respect to the horizontal plane preferably ranges from 5° to 10°.

The supply piping 63d is opened at the center of the bottom wall 91b via the backflow valve 94. The backflow valve 94 on the discharge side is practically the same as the backflow valve 92 on the suction side.

When the bellows 83 is expanded as shown in FIG. 7, the resist solution is sucked into the pump chamber 81 as shown in FIG. 9. Meanwhile, when the bellows 83 is contracted as shown in FIG. 8, the resist solution is discharged from the pump chamber 81 as shown in FIG. 10. Both the supply pipings 63c and 63d are released under atmospheric pressure, so that the pump pressure from the bellows 83 decreases or increases, whereby the resist solution is sucked into or discharged from the pump chamber 81.

It is preferable to use liquid such as Teflon oil, another oil, or pure water as the pressure transfer medium 84 sealed in the tubular diaphragm 93. The use of liquid for the pressure transfer medium 84 can prevent secular changes in capacity of the tubular diaphragm 93 to thereby attain long-term stabilization of displacement specification of the peripheral walls 91a to 91c of the pump chamber 81.

Further, the circulation piping 78 for draining the air bubbles 95 is opened in the ceiling wall 91c of the pump chamber 81. A difference of elevation h is provided between the opening of the circulation piping 78 and the supply piping 63c. The difference of elevation h prevents the air bubbles 95 from entering the supply piping 63c. It should be noted that the circulation piping 78 communicates with the atmosphere via a valve (not shown). The air bubbles 95 gathered at the upper portion within the pump chamber 81 are ejected by opening the valve at regular intervals, for example, every change of the resist tank 62 or the like.

As described above, the discharge port 66b and the circulation port 66c provided at the pump 66 are actually provided in the ceiling wall 91c of the pump 66, and the discharge port 66b is provided at the bottom wall 91b of the pump 66. When the air bubbles 95 mix into the resist solution in the pump 66, the air bubbles 95 gather to the upper portion in the pump 66, and thus the discharge port 66b is provided in the bottom wall 91b of the pump 66 to decrease the air bubbles 95 in the resist solution discharged from the bottom wall 91b of the pump 66 containing comparatively less air bubbles 95.

The circulation port 66c is provided in the ceiling wall 91c of the pump 66 for the reason opposite to that the discharge port 66b is provided in the bottom wall 91b of the pump 66. More specifically, the provision is for removal of the air bubbles 95 more efficiently by returning the resist solution containing comparatively more air bubbles 95 which gather to the upper portion in the pump 66 again to the discharge path.

(Configuration of filter)

A porous member 65a for blocking the discharge path from the supply piping 63b to the supply piping 63c is provided in the filter 65. The porous member 65a can pass only the resist solution through its pores to separate from the resist solution suspended particles and air bubbles mixed in the resist solution. The porous member 65a is a porous or fibrous cylindrical compact made of, for example, polytetrafluorethylene (PFE) or molecular polyethylene. The average pore diameter of the porous member 65a is preferably, for example, 0.05 $\mu$m or less. Further, one end of a drain piping 71 communicates with the filter 65 to branch out from the discharge path defined by the supply pipings 63b and 63c which communicate with the filter 65. The other end of the drain piping 71 communicates with a drain tank (not shown) to lead to the drain tank the resist solution containing the suspended particles, air bubbles, and the like which are separated by the porous member 65a in the filter 65. An air-operated valve 71a is provided along the drain piping 71 to open and close the drain piping 71.

The resist supply unit 61 includes the filter 65 along the discharge path as described above, so that the resist solution is discharged from the resist nozzle 67 after passing through the filter 65.

(Configuration of liquid end sensor)

The liquid end sensor 64 includes a sensor (not shown). This sensor measures the ratio of air bubbles in the liquid end sensor 64. As the air bubbles gather to the upper portion in the liquid end sensor 64, the provision of the sensor as described above can realize detection how much the air bubbles gather. Further, one end of a drain piping 72 communicates with the upper portion of the liquid end sensor 64, and the other end thereof communicates with the drain tank (not shown) to lead to the drain tank air bubbles or the resist solution containing air bubbles. A drain valve 72a is provided along the drain piping 72 to open and close the drain piping 72.

(Configuration of controller)

The pump 66 is connected to the controller 73 to control discharge operation and circulation operation of the resist solution. Further, the liquid end sensor 64 and the switching air-operated valve 68b are connected to the controller 73. The amount of air bubbles obtained from the liquid end sensor 64 is outputted to the controller 73 to switch the flow path in the switching air-operated valve 68b from the gas supply pipe 68c side to the gas supply pipe 68a side to perform air venting operation by $N_2$ pressurization. Furthermore, the valves 67a, 70a, 71a, and 72a are connected to the controller 73 to control the opening and closing of respective pipings during the discharge operation or the bubble venting operation.

(Configuration of circulation system)

As described above, the circulation path is provided for the resist solution supplied from the resist tank 62 via the supply piping 63b to pass through the filter 65, the supply piping 63c, the pump 66, and the circulation piping 78 and return again to the supply piping 63b. The ratio between the resist solution flowing through the circulation path and the resist solution discharged from the discharge port 66b of the pump 66 can be set by the controller 73 as required. Incidentally, this ratio can be set by providing near the circulation port 66c a blocking plate (not shown) for partially blocking the circulation piping 78 and sliding the blocking plate to change the area of blocking the circulation port 66c. It is, of course, possible to change the ratio by the valve 70a.

It is possible to configure the resist solution circulated in the circulation piping 78 at 1 ml/min when the resist solution is supplied from the resist tank 62 at 4 ml/min during the discharge operation. In this case, the resist solution is supplied from the resist nozzle 67 at 3 ml/min. When there are many air bubbles, the air bubbles can be efficiently removed by increasing the ratio of the resist solution circulated. The supply speed of the resist solution as described above can be adjusted by the stepping motor 85 embedded therein.

(Function of controller)

The controller 73 can selectively conduct two controls of discharge control and bubble venting control. The discharge control is a control related with a normal resist solution discharge operation. More specifically, the discharge control is a control of controlling the pump 66 to discharge the resist solution from the resist nozzle 67 along the discharge path and a control of allowing part of the resist solution which has passed through the supply pipings 63a, 63b, and 63c and has been sucked from the suction port 66a into the pump 66 to pass through the circulation piping 78 with air bubbles and dissolved gas gathering in the pump 66.

The bubble venting control is a control related with removal of air bubbles and dissolved gas in the resist solution. More specifically, the bubble venting control is a control of removing the air bubble and the dissolved gas by the filter 65 by blocking the discharge port 66b of the pump 66 to cause the resist solution to stay in the discharge path and switching the switching air-operated valve 68b to send $N_2$ gas from the gas supply pipe 68a to the resist tank 62 to pressurize the resist solution in the resist tank 62.

(Resist supply process)

Figure 11:
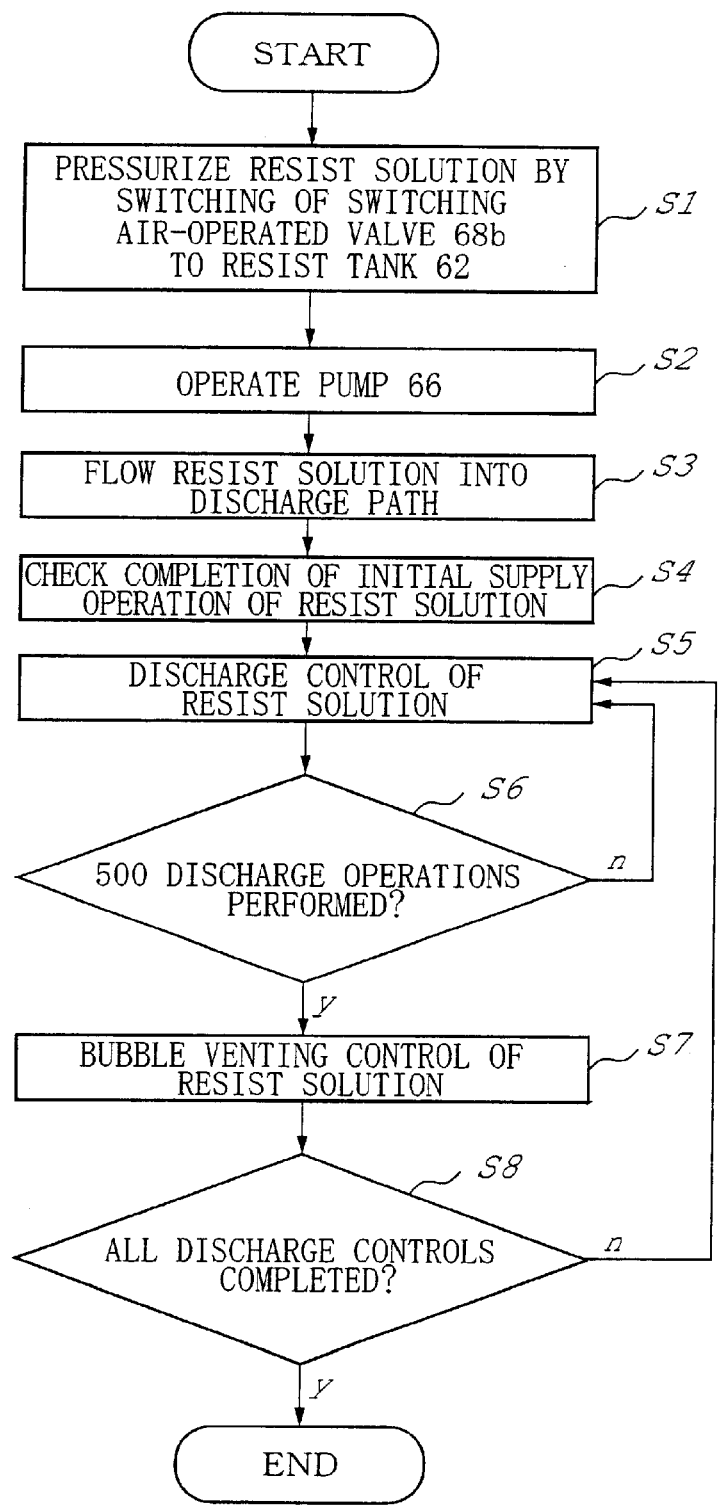
FIG. 11 is a flowchart of resist supply operation according to the embodiment.

The operation of the treatment solution supply apparatus according to this embodiment will be explained hereafter with reference to a flowchart shown in FIG. 11.

First, the switching air-operated valve 68b is switched concurrently with the start of the resist supply unit 61 to allow the gas supply pipe 68a to communicate with the resist tank 62 to pressurize the resist solution in the resist tank 62 in this state (s1).

Then, the pump 66 is operated with this pressurization state kept (s2), thereby flowing the resist solution along the discharge path (s3).

With the inflow of the resist solution, air in the supply pipings 63a to 63d and the filter 65 being successively pushed out, air first flows through the pipings 63a to 63d and the like, and then a resist solution containing a large amount of bubbles flows. The resist solution further flowing in, the amount of bubbles gradually decreases, and finally a resist solution containing few bubbles begins to flow through the pipings 63a to 63d. The completion of the initial supply operation of the resist solution can be recognized by visually checking the resist solution reaching the resist nozzle 67 or by checking a predetermined amount or more of the resist solution being stocked in the liquid end sensor 64 by an output of the sensor 64.

After the check of the predetermined amount of the resist solution being stocked (s4), the discharge control of the resist is started (s5). The discharge control of the resist is the same as in the aforesaid inflow operation of the resist solution, but the discharge control is conducted so that the controller 73 gives the pump 66 step inputs to cause it to pulse, and, for example, the amount of the resist discharged from the resist nozzle 67 via the supply piping 63d by one drive of the pump is 4 cc. In this case, assuming that the amount of the resist discharged from the liquid end sensor 64 is 5 cc, the remaining 1 cc resist solution circulates in the circulation piping 78 to return to the discharge path. After the check of 500 times discharge operations having been performed, the bubble venting control of the resist solution is conducted (s7). Finally, the completion of all the discharge operations is checked (s8), whereby the resist supply is completed.

(Discharge control process)

Figure 12:
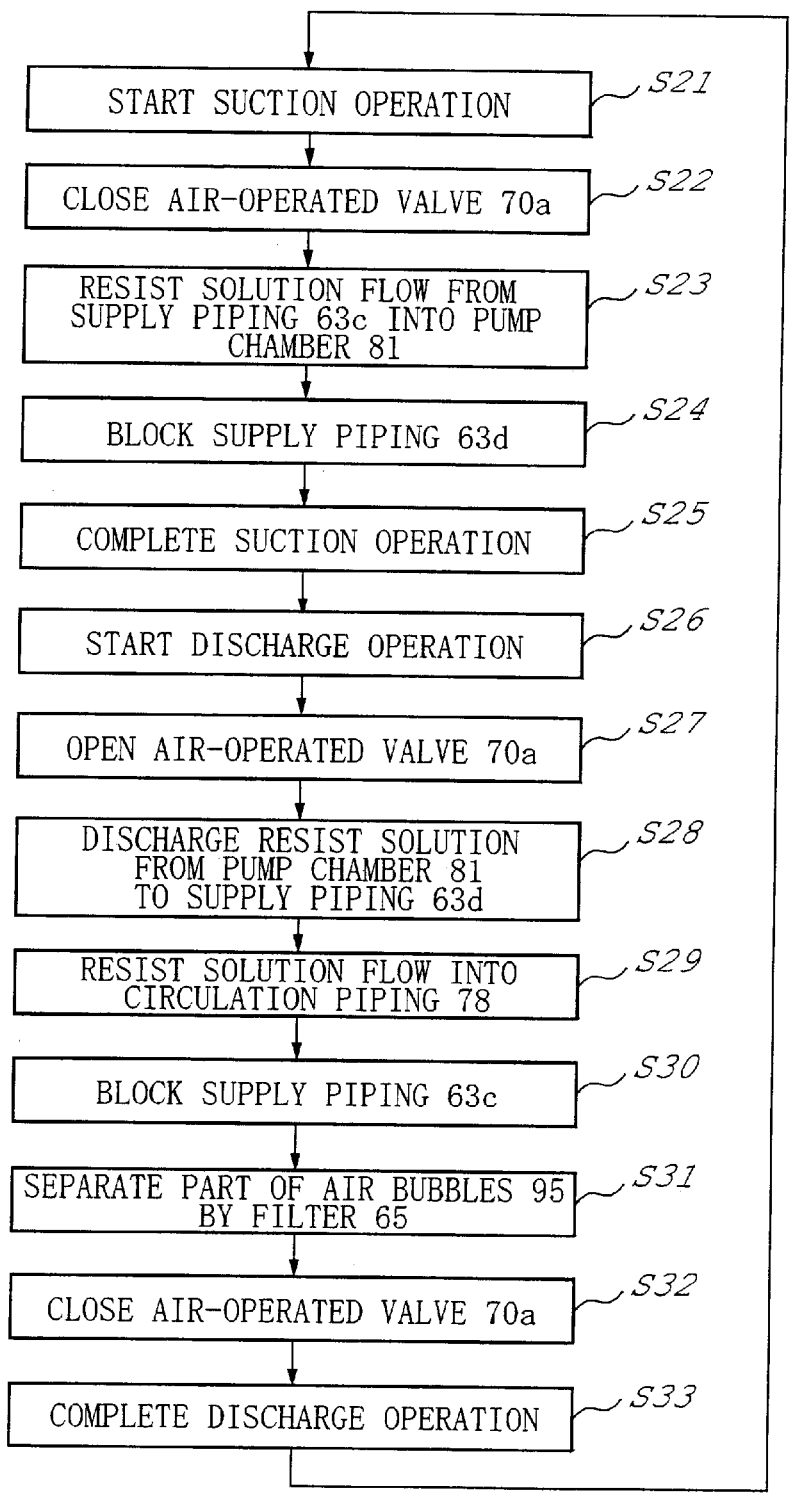
FIG. 12 is a flowchart of discharge control according to the embodiment.

The more detailed process of the discharge control will be explained using a flowchart of FIG. 12.

The discharge control can be divided into two for the discharge operation and the suction operation. During the suction operation (s21), a large amount of the resist solution passing through the filter 65 flows into the pump chamber 81 via the supply piping 63c, and the air bubbles 95 also flow into there (s23). The amount of the resist solution flowing into the pump chamber 81 via the supply piping 63c is, for example, 5 cc. In this event, the air-operated valve 70a of the circulation piping 78 is closed (s22). The action of the air-operated valve 70a blocks the path of the circulation piping 78, thereby preventing the resist solution from flowing to the downstream from the valve 70a. Further, the supply piping 63d is blocked by a ball, thereby preventing the resist solution from flowing into the supply piping 63d (s24). The air bubbles 95 in the resist solution gather to the upper portion in the pump chamber 81 due to the difference in specific gravity from the resist solution.

When a sufficient amount of the resist solution is flowed into the pump chamber 81, the suction operation is completed (s25), and then the discharge operation is started (s26). During the discharge operation, the supply piping 63d is opened to allow the resist solution to reach the resist nozzle 67 (s28). The amount of the resist discharged to the supply piping 63d is, for example, 4 cc. Concurrently with the discharge period, the air-operated valve 70a is opened (s27). This allows the resist solution to flow into together with a large amount of the air bubbles 95 also into the circulation piping 78 (s29). The amount of the resist solution sucked into the pump chamber 81 is 5 cc and the amount of the resist solution discharged is 4 cc, and thus the amount of the resist solution flowing into the circulation piping 78 is 1 cc. During this discharge period, the supply piping 63c of the pump 66 is blocked by the ball 92a, thereby preventing the resist solution from flowing in (s30).

The resist solution flowing into the circulation piping 78 can not reach the resist nozzle 67, and most of it returns into the pump chamber 81, resulting in a comparative low solution pressure. This resist solution at a low solution pressure is supplied to the supply piping 63b and 63c around the filter 65. In the resist solution at a low solution pressure, in addition to the air bubbles 95 which have originally been manifested, the air bubbles 95 dissolved in the resist solution at a high solution pressure become manifest. The manifested air bubbles 95 pass through the filter 65 again. Thereby, part of the air bubbles 95 can be separated (s31). Thereafter, the air-operated valve 70a is closed again (s32), whereby the discharge operation is completed (s33), and then the suction operation is started again (s21).

The pressurization of the resist solution in the resist tank 62 by $N_2$ gas during the suction and discharge operations may be set to be the same period with the discharge operation of the pump 66, but the pressurization may not be performed during period other than the discharge operation.

Figure 13A:
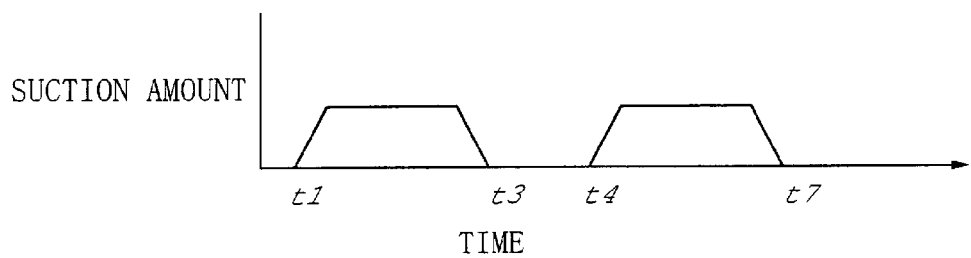
FIG. 13A is a view showing a chart of suction periods in the discharge control according to the embodiment.
Figure 13B:
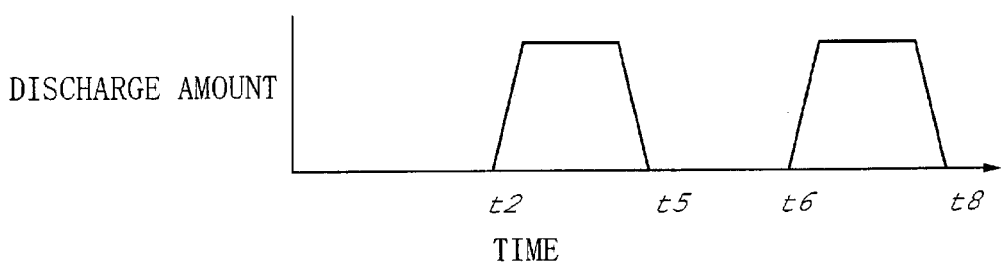
FIG. 13B is a view showing a chart of discharge periods in the discharge control according to the embodiment.
Figure 13C:
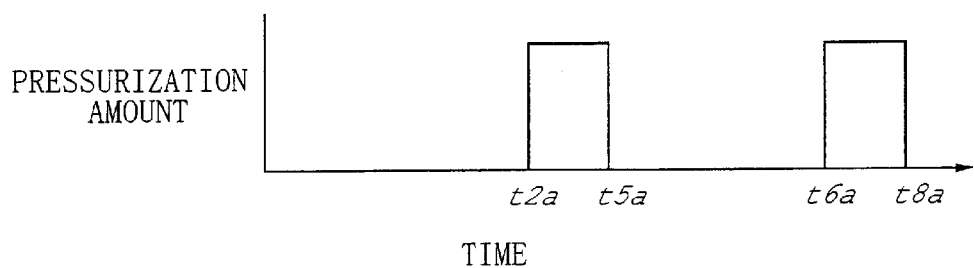
FIG. 13C is a view showing a chart of pressurization periods in the discharge control according to the embodiment.

The resist solution is always pressurized, however, whereby the solution pressure in the resist solution increases. Accordingly, this increases the dissolved gas in the resist solution, and thus the pressurization is released, for example, during the same period with the suction operation of the resist solution or during part of the period. The switching air-operated valve 68b is switched during this period to release $N_2$ gas into the air via the gas supply pipe 68c. FIG. 13 is a timing chart showing the pressurization periods by $N_2$ gas during the resist discharge control of this embodiment. FIG. 13A shows suction periods, FIG. 13B discharge periods, and FIG. 13C pressurization periods. The horizontal axis shows time, and the vertical axes show the amounts of resist in FIGS. 13A and 13B and the vertical axis shows the amount of pressurization in FIG. 13C. As shown in FIGS. 13A, 13B, and 13C, the suction operations are performed by the pump 66 during periods from t1 to t3 and from t4 to t7, and the discharge operations are performed during periods from t2 to t5 and from t6 to t8. During the periods, the pressurization is started at t2a and t6a which are slightly after the discharge start time t2 and t6, and the pressurization is completed at t5a and t8a before the completion of the discharge operations.

The $N_2$ gas pressurization may not be performed at all during the suction and discharge operations. In this case, after the initial supply operation of the resist solution is checked (s4), the valve 68b may be switched to release the pressurization.

During the conduction of the resist discharge control, it is difficult to cause all the air bubbles 95 to pass through the circulation path to be removed by the filter 65. Therefore, after, for example, 500 times of the aforesaid discharge operations are performed (s6), the bubble venting control is conducted (s7).

Figure 14:
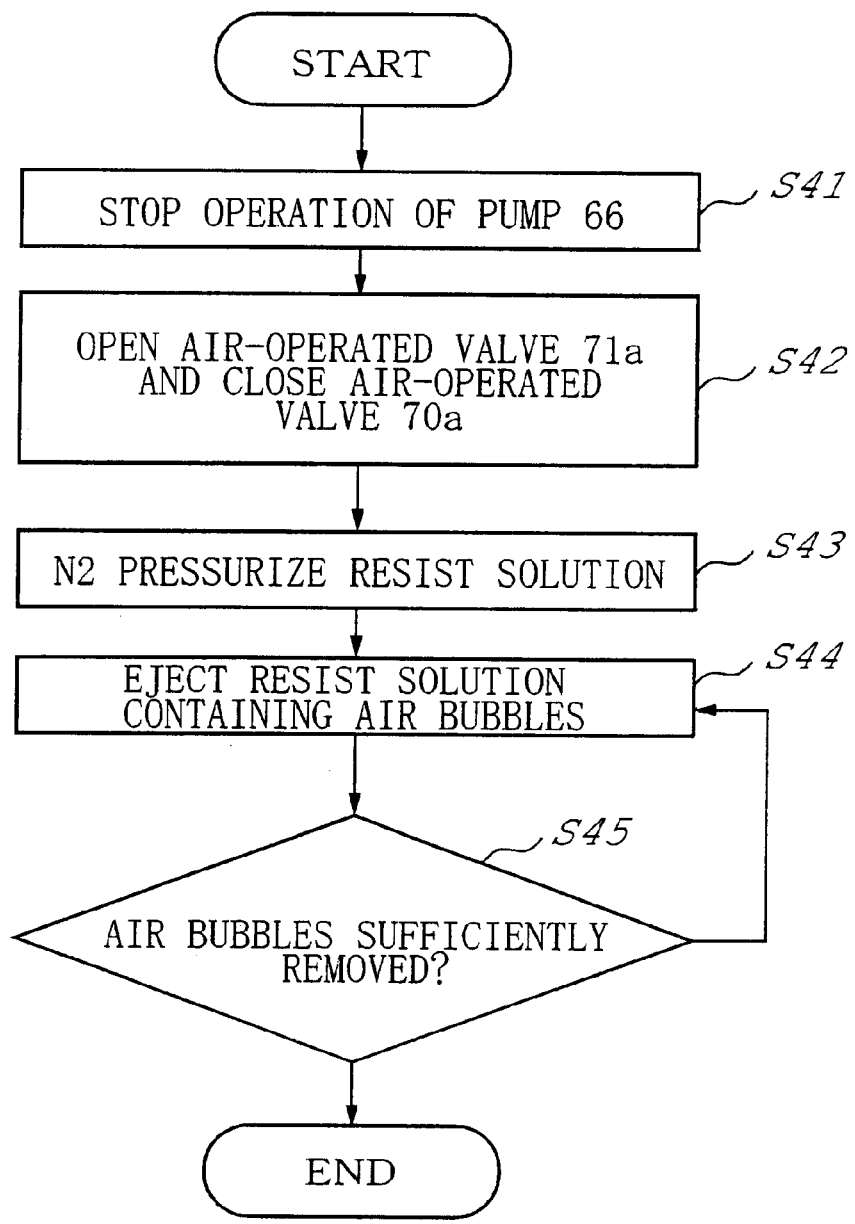
FIG. 14 is a flowchart of bubble venting control according to the embodiment.

A flowchart of the bubble venting control is shown in FIG. 14.

In the bubble venting control, for example, the pump 66 is stopped to prevent the resist solution from flowing from the supply piping 63c into the pump 66 (s41). In this state, the resist solution which has been sufficiently at a low pressure by the aforesaid discharge operation flows into the supply piping 63b. The air-operated valve 71a is then opened, and the valve 70a is closed (s42). Thereafter, the switching air-operated valve 68b is switched to the gas supply pipe 68a side to pressurize the resist solution in the resist tank 62 (s43). This separates air bubbles which have become manifested in the resist solution by the filter 65 and ejects the resist solution containing many air bubbles from the drain piping 71 to the drain tank (not shown) (s44). Incidentally, part of the resist solution is discharged from the supply piping 63d. Because the resist solution flowing into the supply piping 63d has passed through the filter 65, most of air bubbles 95 have, of course, been removed therefrom. The resist solution contains sufficient air bubbles when being ejected, eliminating most wasteful disposal of the resist solution. In addition to that, this bubble venting operation is performed after the conduct of a large number of resist discharge controls, thereby decreasing the amount of the resist ejected to the drain tank to a minimum. It should be noted that when the air bubbles 95 can not be removed sufficiently by one bubble venting control, another bubble venting operation may be performed (s45). In this case, it is possible that the amount of air bubbles is checked by observing by, for example, a sensor (not shown) provided in the filter 65 to determine whether or not another bubble venting operation is necessary. The determination may naturally be performed by automatic control using the controller 73.

Moreover, the filter 65 is installed on the upstream side of the discharge path from the pump 66, thereby preventing as much as possible the resist solution containing air bubbles from recirculating.

After the check of all the discharge controls being completed, the resist supply is completed. Incidentally, when all the discharge controls are not completed, the discharge control is started again.

Figure 15:
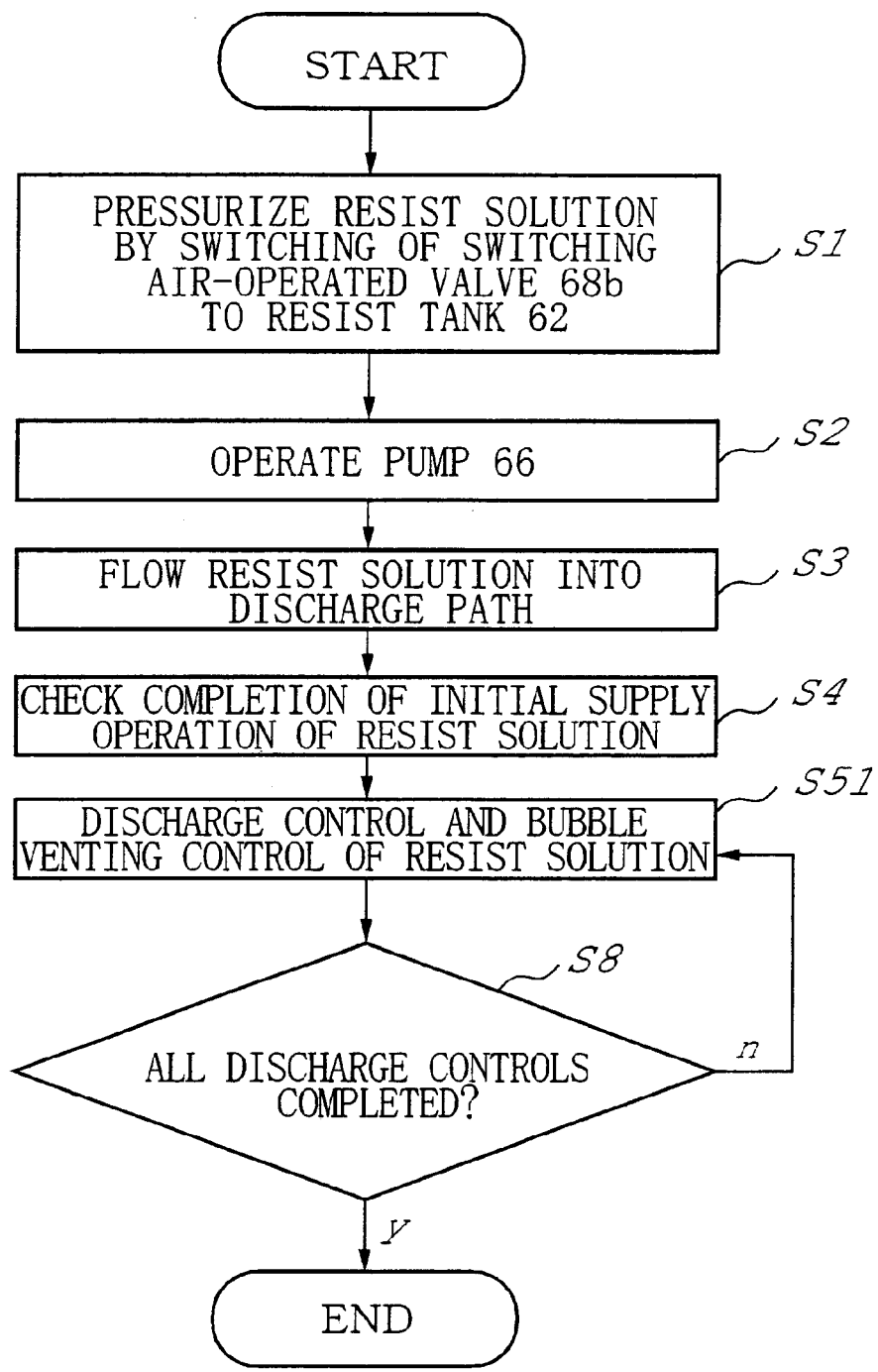
FIG. 15 is a flowchart of resist supply operation according to a modification of the embodiment.

It should be noted that the case in which the bubble venting control and the discharge control are separately conducted is described in this embodiment, but it is unnecessary to conduct the bubble venting control and the discharge control independently. Even only the discharge control can manifest air bubbles in the resist solution every discharge operation by recirculating and filtering the resist. A flowchart in the case in which bubble venting is performed only by the discharge control is shown in FIG. 15. When the bubble venting is performed only by the discharge control, as shown in FIG. 15, the bubble venting may be performed every time the air-operated valve 71a is opened during the discharge period of the pump 66. In this case, it is not necessary to perform the opening of the air-operated valve 71a during the whole discharge period, but the air-operated valve 71a may be opened, for example, after the pressurization period of the resist solution by $N_2$ gas in the discharge period.

Figure 16:
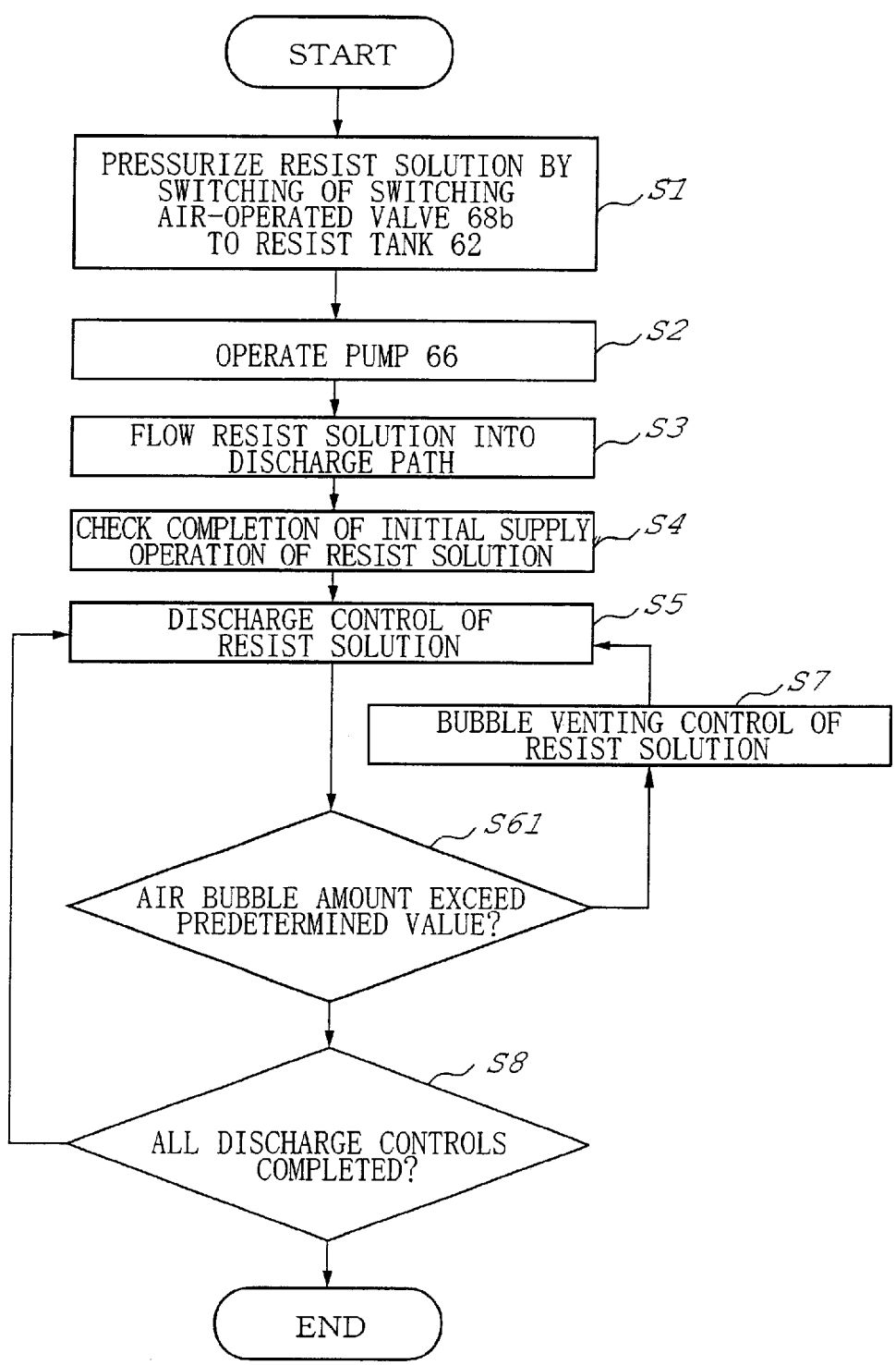
FIG. 16 is a flowchart of resist supply operation according to a modification of the embodiment.

It should be noted that this bubble venting control may be conducted, for example, by providing a sensor (not shown) in the filter 65 or the like and calculating the amount of air bubbles from its sensor output, and when the calculated value exceeds a predetermined value. The resist supply operation in this case will be shown in a flowchart shown in FIG. 16.

(Second embodiment)

Figure 17:
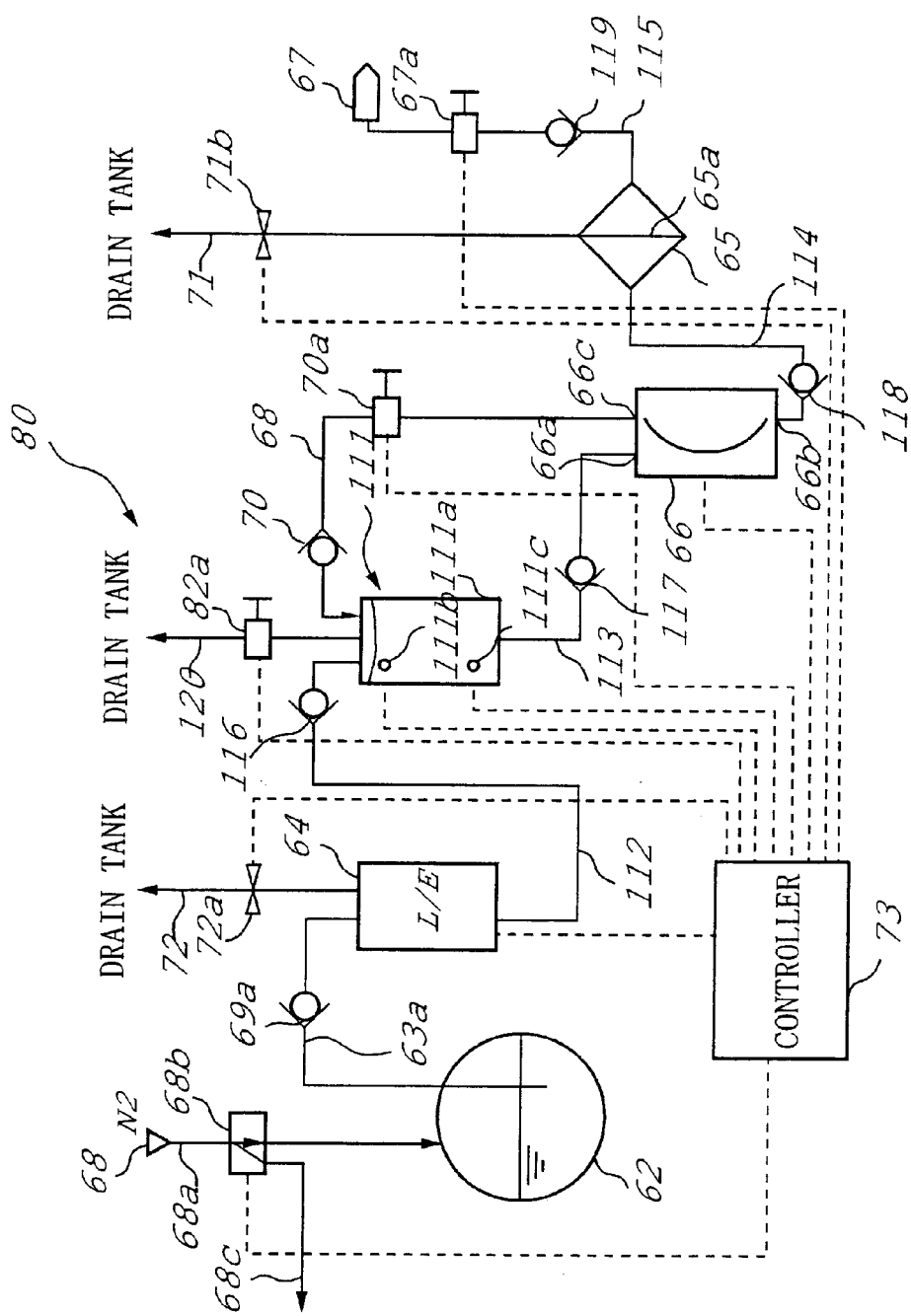
FIG. 17 is a schematic view showing a treatment solution supply system of a resist supply unit according to a second embodiment of the present invention.

FIG. 17 is a view for explaining a substrate processing apparatus according to the second embodiment of the present invention. It should be noted that the detailed description of portions of the second embodiment in common with the above-described first embodiment is omitted, and the same numerals are given to the same components. Although the filter is used for removing the air bubbles and the dissolved gas in the first embodiment, a trap tank is provided along the circulation path of the resist solution to remove the air bubble and the dissolved gas in the resist solution in this embodiment.

(Configuration of treatment solution supply apparatus)

As shown in FIG. 17, a resist (treatment solution) supply apparatus 80 includes a resist tank 62 as a container and is provided with along supply pipings 63a 112, 113, 114, and 115 as a discharge path of the resist solution supplied from the resist tank 62, in order from the upstream side to the downstream side of the discharge path: a liquid end sensor 64; a trap tank 111 as a remover for separating and removing air bubbles in the resist solution; a pump 66 for discharging and sucking the resist solution; a filter 65 for venting the air bubbles and separating and removing foreign substances such as a suspended particle and the like; and a resist nozzle 67 for discharging the resist solution.

The resist tank 62 communicates with the liquid end sensor 64 through the supply piping 63a, the liquid end sensor 64 communicates with the trap tank 111 through the supply piping 112, the trap tank 111 communicates with the pump 66 through the supply piping 113, the pump 66 communicates with the filter 65 through the supply piping 114, and the filter 65 communicates with the resist nozzle 67 through the supply piping 115.

Further, to the resist tank 62 an $N_2$ gas supply mechanism 68 for pressurizing the resist solution in the tank 62 is connected via a gas supply pipe 68a to prevent occurrence of air bubbles in the resist solution. Furthermore, a switching air-operated valve 68b is provided along the gas supply pipe 68a to lead $N_2$ gas via a gas supply pipe 68c into a path different from the path for supplying it into the resist tank 62 by its switching operation. The $N_2$ gas led into the gas supply pipe 68c is released outside the resist coating unit (COT) or its clean room. Incidentally, the detailed switching operation of the air-operated valve 68b is the same as in FIGS. 6B and 6C.

(Configuration of pump and circulation system)

The periphery of the pump 66 is defined by a bottom wall, a side wall, and a ceiling wall. The pump 66 includes a suction port 66a for receiving a sucked resist solution and a discharge port 66b for discharging the resist solution and supplying it to the resist nozzle 67, and the flow path of the resist solution from the suction port 66a to the discharge port 66b set the discharge path of the resist solution. Further, the pump 66 is provided with a circulation port 66c for releasing the resist solution from within the pump 66 to circulate the resist solution. One end of a circulation piping 78 communicates with the circulation port 66c. The other end of the circulation piping 78 communicates with the ceiling wall of the trap tank 111. This circulation piping 78 defines a circulation path which is a path different from the discharge path. It should be noted that positional relations in the vertical direction between the suction port 66a, the discharge port 66b, and the circulation port 66c provided at the pump 66, the detailed configuration of the pump 66, and the detailed configuration in a pump chamber 81 are defined as in the first embodiment.

(Configuration of check valve)

Check valves 69a, 116, 117, 118, and 119 are correspondingly provided along the supply pipings 63a, 112, 113, 114, and 115 which define the discharge path of the resist solution to prevent the resist solution from flowing back through the discharge path. Further, a check valve 70 is provided along the circulation piping 78 to prevent the resist solution from flowing into the opposite direction to the circulation direction.

(Configuration of filter)

A porous member 65a for blocking the discharge path from the supply piping 63b to the supply piping 63c is provided in the filter 65. The porous member 65a can pass only the resist solution through its pores to separate from the resist solution suspended particles and air bubbles mixed in the resist solution. Further, one end of a drain piping 71 communicates with the filter 65 to branch out from the discharge path defined by the supply pipings 114 and 115 which communicate with the filter 65. The other end of the drain piping 71 communicates with a drain tank (not shown) to lead to the drain tank the resist solution containing the suspended particles and air bubbles which are separated by the porous member 65a in the filter 65. A drain valve 71b is provided along the drain piping 71 to open and close the drain piping 71.

(Configuration of liquid end sensor)

The liquid end sensor 64 includes a sensor (not shown). This sensor measures the ratio of air bubbles in the liquid end sensor 64. As the air bubbles gather to the upper portion in the liquid end sensor 64, the provision of the sensor as described above can realize detection how much the air bubbles gather. Further, one end of a drain piping 72 communicates with the upper portion of the liquid end sensor 64, and the other end thereof communicates with the drain tank (not shown) to lead to the drain tank air bubbles or the resist solution containing air bubbles. A drain valve 72a is provided along the drain piping 72 to open and close the drain piping 72.

(Configuration of trap tank)

The trap tank 111 includes a tank main body 111a whose periphery is defined by a ceiling wall, a side wall, and a bottom wall and an upper sensor 111b and a lower sensor 111c provided in the tank main body 111a for detecting the solution level of the resist solution in the main body 111a. The sensors 111b and 111c detect the ratios of air bubbles at the upper portion and the lower portion in the tank main body 111a respectively. As the air bubbles gather to the upper portion in the tank main body 111a, the provision of two sensors in the vertical direction of the tank main body 111a as described above can realize detection how much the air bubbles gather at three levels. Further, one end of a drain piping 120 communicates with the ceiling wall of the tank main body 111a, and the other end thereof communicates with the drain tank (not shown) to lead to the drain tank air bubbles or the resist solution containing air bubbles. A drain valve 120a is provided along the drain piping 120 to open and close the drain piping 120.

Further, a porous member (not shown) is provided in the tank main body 111a as in the filter 65 to block the discharge path from the supply piping 112 to the supply piping 113. This porous member can pass only the resist solution through its pores to separate from the resist solution suspended particles and air bubbles mixed in the resist solution. Further, one end of the drain piping 120 communicates with the tank main body 111a to branch out from the discharge path. The other end of the drain piping 120 communicates with the drain tank (not shown) to lead to the drain tank the resist solution containing the suspended particles and air bubbles which are separated by the porous member. An air-operated valve 82a is provided along the drain piping 120 to open and close the drain piping 120.

(Configuration of controller)

The pump 66 is connected to a controller 73 to control discharge operation and circulation operation of the resist solution. Further, the upper sensor 111b, the lower sensor 111c, and the switching air-operated valve 68b are connected to the controller 73. The amounts of air bubbles obtained from the sensors 111b and 111c are outputted to the controller 73 to switch the flow path in the switching air-operated valve 68b from the gas supply pipe 68c side to the gas supply pipe 68a side to perform air venting operation by $N_2$ pressurization. Furthermore, the valves 67a, 70a, 71a, 72a, and 82a are connected to the controller 73 to control the opening and closing of respective pipings during the discharge operation or the bubble venting operation. Incidentally, the remaining function of the controller 73 is in common with the first embodiment unless mention is made, and thus the description is omitted.

(Configuration of circulation system)

As described above, the circulation path is provided for the resist solution supplied from the resist tank 62 via the supply piping 63b to pass through the trap tank 111, the supply piping 113, the pump 66, and the circulation piping 78 and return again to the trap tank 111. The ratio between the resist solution flowing through the circulation path and the resist solution discharged form the discharge port 66b of the pump 66 can be set by the controller 73 as required. For example, it is possible to configure the resist solution circulated in the circulation piping 78 at 1 ml/min when the resist solution is supplied from the resist tank 62 at 4 ml/min during the discharge operation. When there are many air bubbles, the air bubbles can be efficiently removed by increasing the ratio of the resist solution circulated. The supply speed of the resist solution as described above can be adjusted by the stepping motor 85 embedded therein.

(Resist supply process)

The resist supply flow according to this embodiment will be explained hereafter with FIG. 18. Incidentally, the rough flow of the resist supply process is in common with that in FIG. 11, and thus the description thereof is omitted.

Figure 18:
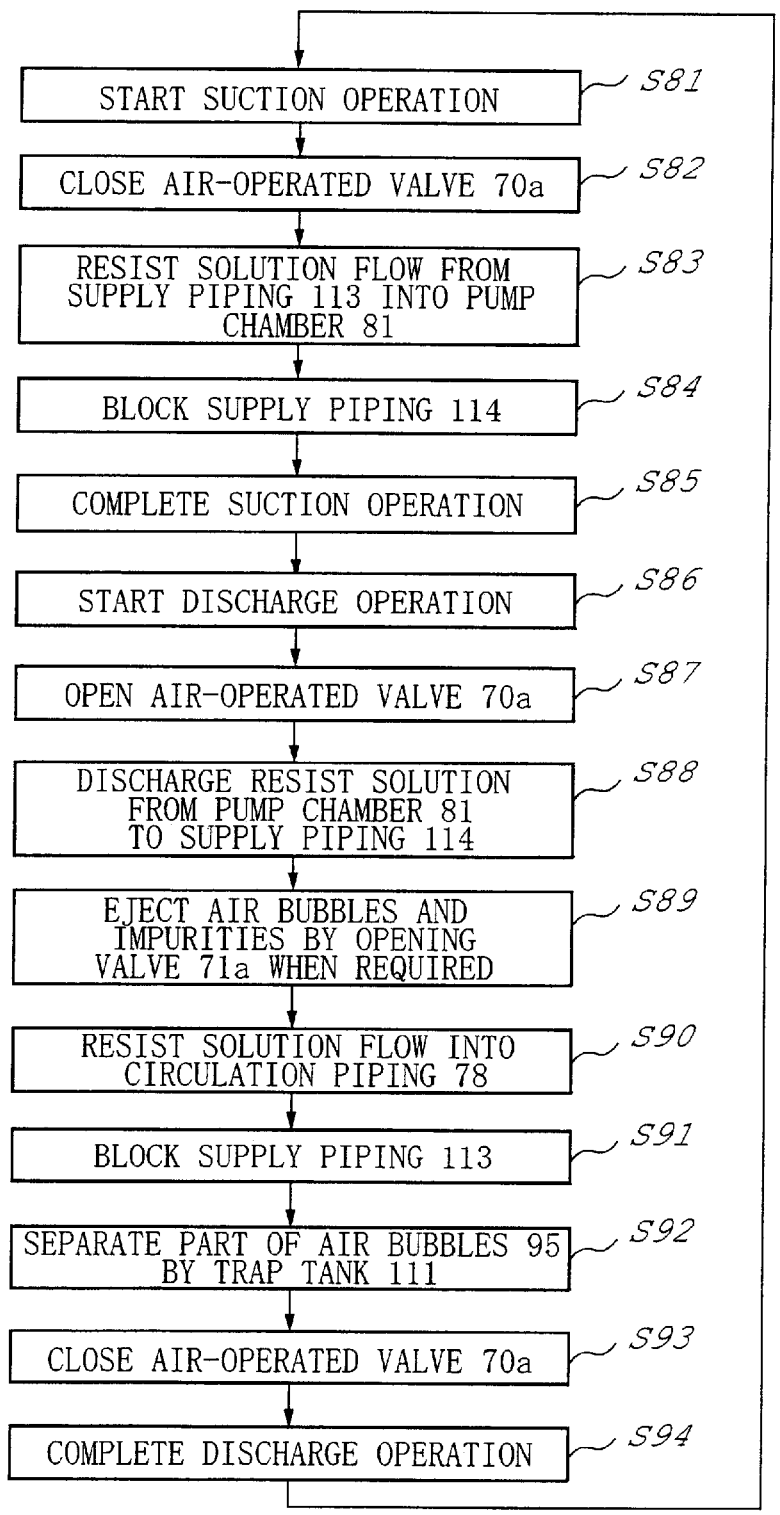
FIG. 18 is a flowchart of resist supply operation according to the embodiment.

FIG. 18 is a view showing the flowchart related with the discharge control of the resist solution according to this embodiment. The discharge control can be divided into two for the discharge operation and the suction operation.

During the suction operation (s81), a large amount of the resist solution passing through the trap tank 111 flows into the pump chamber 81 via the supply piping 113 (s83). The amount of the resist solution flowing into the pump chamber 81 via the supply piping 113 is, for example, 5 cc. In this event, the air-operated valve 70a of the circulation piping 78 is closed (s82). Further, the supply piping 114 is blocked by a ball, thereby preventing the resist solution from flowing into the supply piping 114 (s84). The air bubbles 95 in the resist solution gather to the upper portion in the pump chamber 81 due to the difference in specific gravity from the resist solution.

When a sufficient amount of the resist solution is flowed into the pump chamber 81, the suction operation is completed (s85), and then the discharge operation is started (s86). During the discharge operation, the supply piping 114 is opened to allow the resist solution to reach the resist nozzle 67 (s88). The amount of the resist discharge to the supply piping 114 is, for example, 4 cc. Concurrently with the discharge period, the air-operated valve 70a is opened (s87).

During this discharge period, the valve 71b is opened in concurrent with the period as required to remove air bubbles and suspended particles (s89). This step s89 may be performed when, for example, a sensor (not shown) for detecting the amount of air bubbles and the like is provided in the filter 65 and the step s89 is required based on its sensor output, or when whether the step s89 is necessary or not is determined by the visual check and it is required. Further, the drainage of the resist solution at the filter 65 may be performed concurrently with the bubble venting control. The resist solution, through the above-described steps, flows together with a large amount of the air bubbles 95 into the circulation piping 78 (s90). The amount of the resist solution sucked into the pump chamber 81 is 5 cc and the amount of the resist solution discharged is 4 cc, and thus the amount of the resist solution flowing into the circulation piping 78 is 1 cc.

During this discharge period, the supply piping 113 of the pump 66 is blocked by the ball 92a, thereby preventing the resist solution from flowing in (s91). Part of the air bubbles 95 in the resist solution flowing into the circulation piping 78 are trapped by the trap tank 111. Thereby, the part of the air bubbles 95 can be separated (s92). Thereafter, the air-operated valve 70a is closed again (s93), whereby the discharge operation is completed (s94), and then the suction operation is started again (s81).

It should be noted that the $N_2$ pressurization period of the resist tank 62 is the same as that of the first embodiment.

Next, after 500 times of the aforesaid discharge operations are performed, the bubble venting control of separating and removing the air bubbles 95 trapped by the trap tank 111 is conducted. The bubble venting control in this embodiment is conducted as in the first embodiment by $N_2$ pressurizing the resist solution in the resist tank 62 to push out the resist solution containing the air bubbles 95 from the trap tank 111. This bubble venting control is conducted along the steps shown in FIG. 14 of the first embodiment. In this embodiment, the trap tank 111 is provided with the sensors 111b and 111c, so that whether or not the bubble venting has been sufficiently performed can be easily checked. For example, when the fact that a large amount of air bubbles has been stocked is checked by the sensor 111c, the bubble venting is performed to a level at which at least the sensor 111b can check that the amount of air bubbles is small.

According to this embodiment, in addition to the same effects as those of the first embodiment, the bubble venting can be performed further by the filter 65 as described above. As a result, the amount of air bubbles can be decreased greater than in the first embodiment. Furthermore, the bubble venting can be performed while checking the amount of air bubbles by the trap tank 111, thereby enabling reliable bubble venting control to eliminate a danger of supplying the resist solution containing a large amount of air bubbles.

Additionally, another merit can be provided by the trap tank 111 when the resist solution is exchanged for another type. More specifically, when the resist solution is exchanged for another type in the case in which the resist tank 62 and the pump 66 are connected only by the piping without the trap tank 111, it takes a substantially long time to exchange completely the resist solution in the piping for another, but the provision of the trap tank 111 shortens the time required for the exchange.

The present invention is not limited to the above-described embodiment. The case in which the suction port 66a and the circulation port 66c provided at the pump 66 which controls the discharge operation and the circulation operation of the resist solution are provided in the ceiling wall of the pump 66 and the discharge port 66b is provided in the bottom wall is shown in the above-described embodiment, but the present invention is naturally not limited to this case.

In the case in which the discharge port 66b is provided at the lower side of the pump 66 with respect to the suction port 66a, both of them may be provided, for example, in the side wall of the pump 66. The pump 66, not limited to one whose periphery is defined by the bottom wall, side wall, and ceiling wall, may naturally have another configuration. In this case, the configuration in which the discharge port 66b is provided at the lower side of the pump 66 with respect to the suction port 66a, and the circulation port 66c is provided at the upper side of the pump 66 with respect to the discharge port 66b can keep the removal efficiency of air bubbles high.

For example, the pump chamber 81 may be inclined 1° to 20° with respect to the horizontal plane so that the opening of the circulation piping 78 is located at the highest position of the pump chamber 81. In this case, the air bubbles 95 are vented more quickly from the pump chamber 81 via the circulation piping 78. Furthermore, the pump chamber 81 shown in FIG. 7 to FIG. 10 may be inclined 90° with respect to the horizontal plane.

Moreover, it is natural to conduct the same control using as the pump 66 a bellows-type pump in which a bellows is directly connected to a pump in addition to the tubular diaphragm-type pump.

Although the case in which each drain piping communicates with the drain tank to eject the resist solution containing air bubbles and the like is shown, it is possible to return each drain piping to the resist tank for recycling. In this case, the amount of resist ejected is further decreased, enabling more effective use of the resist.

The air-operated valve 71a or 82a, provided along the drain piping of the filter 65 in the first embodiment or the trap tank 111 in the second embodiment, for controlling the opening and closing of the drain piping is shown, but, not limited to this, it may be one for controlling not only the opening and closing but also the flow rate during each of periods of discharge, suction, and bubble venting.

Moreover, the filter 65 may be installed along the supply piping 113 which connects the trap tank 111 and the pump 66. The filter 65 is provided on the upstream side from the pump 66 as described above, thereby stabling the discharge of the resist solution by the pump 66 even with occurrence of clogging in the filter 65.

Further, the return of the resist solution from the pump 66 by the circulation piping 78 is not limited to the case of going back to the trap tank 111. It is suitable that such return of the resist solution goes back to the resist tank 62.

The flow in which the discharge operation is started after the completion of the suction operation of the pump and the suction operation is started after the completion of the discharge operation is shown in the flowchart of the embodiments for convenience of explanation, but the present invention is not limited to this. For example, the discharge operation may be started before the completion of the suction operation, or the suction operation may be started before the completion of the discharge operation.

Further, the case in which the present invention is applied to the resist solution supply apparatus is shown in the above-described embodiments, but the present invention is applicable to all the solution treatment system units, for example, a developing solution supply unit, an anti-reflection film solution (ARC solution) coating unit, and the like, where occurrence of air bubbles is a problem due to the use of a solution with a low viscosity According to the present invention, air bubbles contained in a treatment solution can be efficiently removed. Further, it is possible to remove air bubbles in a shorter time than by an existing method of removing air bubbles by pressure difference using a permeable membrane.

What is claimed is:

1. A treatment solution supply apparatus for supplying a treatment solution onto a substrate, comprising:

a discharge nozzle for discharging the treatment solution onto the substrate;

a container for storing the treatment solution;

a supply piping for connecting the discharge nozzle and the container;

a pump provided along the supply piping;

a pump drive mechanism for controlling an operation of the pump;

a circulation piping having one end branching out from the piping between the container and the pump and another end provided at the pump;

a filter, provided at some midpoint along the supply piping and between the one end and the other end of the circulation piping, for filtering the treatment solution to remove a foreign substance;

a drain piping for draining the treatment solution filtered by the filter and containing the foreign substance; and a valve provided along the drain piping for controlling a flow rate of the treatment solution drained from the filter.

2. An apparatus as set forth in claim 1, further comprising:

a pressurizer for pressurizing the treatment solution in the container; and a controller for opening the valve during a pressurization period by the pressurizer.

3. An apparatus as set forth in claim 1, further comprising;

a remover, provided on the downstream side from the pump and the upstream side from the discharge nozzle, for removing air bubbles in the treatment solution.

4. An apparatus as set forth in claim 1, wherein the pump includes a circulation port communicating with the circulation piping, a discharge port communicating with the downstream side of the supply piping, and a suction port communicating with the upstream side of the supply piping, and wherein the pump drive mechanism blocks the discharge port during a suction period, blocks the suction port during a discharge period, and supplies the treatment solution to the circulation piping.

5. An apparatus as set forth in claim 4, wherein the circulation piping is provided with a circulation rate controller for controlling a discharge rate of the treatment solution discharged from the discharge port during the discharge period out of the treatment solution stocked in the pump during the suction period and a circulation rate of the remaining of the treatment solution circulated through the circulation piping.

6. An apparatus as set forth in claim 1, wherein the filter includes a porous member for trapping the foreign substance in the treatment solution.

7. An apparatus as set forth in claim 1, wherein the filter includes a solution level sensor for detecting at least one solution level, so that whether a bubble venting operation is necessary or not is determined based on the solution level in the filter detected by the solution level sensor.

8. An apparatus as set forth in claim 4, wherein the circulation port is opened at an upper portion of the pump from the discharge port.

9. An apparatus as set forth in claim 1, wherein the treatment solution is a resist solution.

10. A treatment solution supply method of supplying a treatment solution onto a substrate, comprising:

a step of preparing a discharge nozzle for discharging the treatment solution onto the substrate; a container for storing the treatment solution; a supply piping for connecting the discharge nozzle and the container; a pump provided along the supply piping; a pump drive mechanism for controlling an operation of the pump; a circulation piping having one end branching out from the piping between the container and the pump and another end provided at the pump; a filter, provided at some midpoint along the supply piping and between the one end and the other end of the circulation piping, for filtering the treatment solution to remove a foreign substance; a drain piping for draining the treatment solution filtered by the filter and containing the foreign substance; and a valve provided along the drain piping for controlling a flow rate of the treatment solution drained from the filter;

a suction step of sucking the treatment solution from the container to the pump; and a discharge step of discharging the treatment solution sucked into the pump to the discharge nozzle and circulating the treatment solution through the circulation piping to separate at least part of air bubbles in the treatment solution by the filter.

11. A method as set forth in claim 10, further comprising:

bubble venting step of pressurizing the container and filtering the treatment solution by the filter to drain the treatment solution containing the air bubbles from the drain piping.

12. A method as set forth in claim 11, wherein the bubble venting step is performed in the discharge step.

13. A method as set forth in claim 11, wherein the bubble venting step is performed when an amount of air bubbles in the treatment solution in the supply piping is detected and the amount of air bubbles exceeds a predetermined value in the suction step or in the discharge step.

14. A method as set forth in claim 11, wherein the valve is opened at a timing before the pressurization of the container is started in the bubble venting step.

15. A method as set forth in claim 13, wherein the amount of air bubbles is detected by a solution level sensor provided in the filter.

16. A method as set forth in claim 10, wherein the pump includes a circulation port communicating with the circulation piping, a discharge port communicating with the downstream side of the supply piping, and a suction port communicating with the upstream side of the supply piping, and wherein the pump drive mechanism blocks the discharge port during a suction period, blocks the suction port during a discharge period, and supplies the treatment solution to the circulation piping.

17. A method as set forth in claim 16, wherein the circulation piping includes a flow rate controller for controlling a flow rate of the treatment solution flowing through the circulation piping, and the flow rate controller controls a discharge rate of the treatment solution discharged from the discharge port during the discharge period out of the treatment solution stocked in the pump during the suction period and a circulation rate of the remaining of the treatment solution circulated through the circulation piping.

18. A method as set forth in claim 10, wherein the treatment solution is a resist solution.

* * * * *